United States Patent [19]

Nakatani et al.

[11] Patent Number: 5,811,754
[45] Date of Patent: Sep. 22, 1998

[54] OPTICAL PROCESSING METHOD AND APPARATUS FOR CARRYING OUT THE SAME

[75] Inventors: Hajime Nakatani; Atsushi Sugitatsu; Masao Izumo; Tadao Minagawa; Yasushi Minamitani; Yoshifumi Matsushita; Toshinori Yagi; Nobuyuki Zumoto, all of Amagasaki, Japan

[73] Assignee: Mitsubishi Denki Kabushiki Kaisha, Tokyo, Japan

[21] Appl. No.: 444,871

[22] Filed: May 19, 1995

[30] Foreign Application Priority Data

Jun. 2, 1994 [JP] Japan .................................. 6-121482
Jul. 8, 1994 [JP] Japan .................................. 6-157605

[51] Int. Cl.[6] .................................................. B23K 26/02
[52] U.S. Cl. .............................. 219/121.83; 219/121.7; 219/121.73
[58] Field of Search ........................... 219/121.7, 121.71, 219/121.68, 121.69, 121.83, 121.73, 121.75, 121.74, 121.78, 121.79, 121.8, 121.81; 355/55, 56, 50, 53, 77; 364/474.08; 356/400

[56] References Cited

U.S. PATENT DOCUMENTS

| | | | |
|---|---|---|---|
| 4,737,823 | 4/1988 | Bouwer et al. | 355/56 |
| 4,920,505 | 4/1990 | Suzuki | 355/55 |
| 4,922,290 | 5/1990 | Yoshitake et al. | 355/55 |
| 5,095,190 | 3/1992 | Aketagawa et al. | 219/121.74 |
| 5,105,075 | 4/1992 | Ohta et al. | 355/53 |
| 5,223,693 | 6/1993 | Zumoto et al. | 219/121.73 |
| 5,270,771 | 12/1993 | Sato | 355/53 |
| 5,296,673 | 3/1994 | Smith | 219/121.68 |
| 5,310,986 | 5/1994 | Zumoto et al. | 219/121.68 |

FOREIGN PATENT DOCUMENTS 6-79488  3/1994  Japan .

OTHER PUBLICATIONS

English translation (pp. 1–3) of Excerpt of Collection of Theses in 28th Convention of Laser Processing Engineers of Japan, pp. 51–58, (1992), "Development of Excimer Laser Processing Apparatus for Mass Production".

*Primary Examiner*—Geoffrey S. Evans
*Attorney, Agent, or Firm*—Oblon, Spivak, McClelland, Maier & Neustadt, P.C.

[57] ABSTRACT

An optical processing apparatus for processing optically a workpiece (7) by using a light beam (B). The apparatus is capable of automatically adjusting a imaging magnification to a predetermined value and at the same time maintaining constant a imaging magnification regardless of exchange of masks (3; 100) and workpieces (7) and for ensuring an extended use life of a mask with satisfactory mask function. The apparatus includes a light source system (1) for generating a light beam (B) for illuminating a mask (3; 100) having a predetermined pattern, a imaging lens (5) for copying a pattern image of the mask (3; 100) onto a workpiece (7), a mask moving mechanism (4) for moving the mask in a direction perpendicular to an optical axis (L) of the imaging lens (5), a workpiece moving mechanism for moving the workpiece in a direction perpendicular to the optical axis (L) of the imaging lens (5), a imaging magnification changing mechanism for changing inter-mask/lens/workpiece distance between the mask, the imaging lens and the workpiece, and a central control unit (9) which is comprised of an actual imaging magnification arithmetic module (91) for determining an actual imaging magnification value (M') in terms of a ratio between the copied pattern image and a predetermined pattern, a magnification decision module (92) for making decision whether or not a difference between the actual imaging magnification value and a desired imaging magnification value is smaller than a permissible value, an optical-axis displacement control module (93) responsive to indication that the difference exceeds a permissible value (δ) to thereby arithmetically determine on the basis of the actual and desired imaging magnification values the inter-mask/lens/workpiece distance at which the actual imaging magnification value (M') becomes equal to the desired imaging magnification value (M) for controlling thereby the imaging magnification changing mechanism so that the inter-mask/lens/workpiece distance coincides with the arithmetically determined distance, and a displacement control module for controlling the mask moving mechanism and the workpiece moving mechanism.

33 Claims, 16 Drawing Sheets

| MATERIAL NAME | MOLECULAR STRUCTURE |
|---|---|
| POLYIMIDE | |
| POLYETHYLENE TEREPHTHALATE (PET) | |
| POLYETHYLENE (PE) | |
| POLYURETHANE (PUR) | |
| POLYVINYL CHLORIDE (PVC) | |

| DIELECTRIC MATERIAL OF HIGH REFRACTIVE INDEX | | | DIELECTRIC MATERIAL OF LAW REFRACTIVE INDEX | | |
|---|---|---|---|---|---|
| MATERIAL NAME | MOLECULAR FORMULA | REFRACTIVE INDEX n | MATERIAL NAME | MOLECULAR FORMULA | REFRACTIVE INDEX n |
| HAFNIUM OXIDE | $HfO_2$ | 2.15 | SILICON OXIDE | $SiO_2$ | 1.46 |
| SCANDIUM OXIDE | $Sc_2O_3$ | 2.11 | MAGNESIUM FLUORIDE | $MgF_2$ | 1.38 |
| ALUMINUM OXIDE | $Al_2O_3$ | 1.62 | | | |

FIG. 18

(KrF EXCIMER LASER WAVE LENGTH = 248nm)

| MATERIAL FOR ABRASION PROCESSING | OPTIMAL PROCESSING ENERGY DENSITY (J/cm²) | DEMANDED IMAGING MAGNIFICATION | RECOMMENDABLE IMAGING MAGNIFICATION |
|---|---|---|---|
| POLYIMIDE FILM (PI) | 0.4~1.2 | 1/0.9~1/2.0 | 1/1.3~1/2.0 |
| POLYETHYLENE TEREPHTHALATE (PET) | 0.6~1.0 | 1/1.1~1/1.8 | 1/1.4~1/1.8 |
| POLYETHYLENE (PE) | 0.8~1.2 | 1/1.3~1/2.0 | 1/1.6~1/2.0 |
| POLYURETHANE (PUR) | 0.5~1.0 | 1/1.0~1/1.8 | 1/1.3~1/1.8 |
| POLYVINYL CHLORIDE (PVC) | 1.3~2.0 | 1/1.6~1/2.6 | 1/2.1~1/2.6 |
| GREEN SHEET (ALUMINA SERIES) | 1.0~10 | 1/1.4~1/5.8 | 1/1.8~1/5.8 |
| GREEN SHEET (ZIRCONIA SERIES) | 0.5~10 | 1/1.0~1/5.8 | 1/1.3~1/5.8 |

OPTICAL PROCESSING METHOD AND APPARATUS FOR CARRYING OUT THE SAME

BACKGROUND OF THE INVENTION

1. Field of the Invention

The present invention generally relates to an optical processing method and an apparatus for processing or machining a workpiece such as, for example, a multi-layer printed substrate to form holes such as so-called via-holes, through-holes and the like by making use of energy of a light beam such as a laser beam. More particularly, the invention is concerned with an optical boring method and apparatus for forming holes with high accuracy or precision.

2. Description of Related Art

For a better understanding of the underlying concept of the present invention, description will first be made in some detail of a hitherto known optical processing or machining apparatus of the type mentioned above by reference to the drawings. FIG. 20 shows a typical one of the optical processing apparatuses known heretofore, which will briefly be described below. For more particular, reference should be made to "Collection of Theses in 28-th Convention of Laser Processing Engineers of Japan (GEZER NETSUKAKO KENKYUKAI RONBUNSHU)", pp. 51–58, (1992).

Referring to FIG. 20, the optical processing apparatus illustrated therein is generally comprised of a light source system 1 for generating a light beam for illuminating a mask 3, a mask moving mechanism 4 for moving or displacing the mask 3, a imaging lens 5 for copying or transferring a pattern image of the mask 3 to a workpiece 7 and a workpiece moving mechanism 6 for moving or displacing the workpiece 7.

The light source system 1 is composed of an excimer laser oscillator 11 serving as a light source for emitting a laser beam A having a rectangular shape in cross section. Disposed at a stage succeeding to the excimer laser oscillator 11 is a beam path adjusting system 12 for adjusting a beam direction and a beam rotation angle of the laser beam A emitted from the excimer laser oscillator 11. To this end, the beam path adjusting system 12 is constituted by three mirrors 12a, 12b and 12c.

On the other hand, disposed in succession to the beam path adjusting system 12 is a beam shaping optical system 13 which is composed of two sets of concave and convex cylindrical lenses 13a, 13b; 13c, 13d for converging linearly the laser beam A to a flat laser beam B, wherein the lens elements mentioned above are fixedly mounted on a stationary support 13e. The laser beam B leaving the beam shaping optical system 13 is reflected by an incident-angle adjusting mirror 14 so as to impinge onto the mask 3.

Referring to FIG. 21, the mask 3 is constituted by a light-transmissive substrate 3a as a base plate which is formed of a synthetic quartz material for allowing the laser beam B to transmit therethrough. Deposited on the light-transmissive substrate 3a are a reflecting portion 3b in a predetermined pattern through a vapor deposition process. The reflecting portion 3b is formed in the form of a film such as an aluminum film, a multi-layer dielectric film or the like which exhibits a high reflectivity (i.e., reflectivity not less than 99%). The reflecting portion 3b is pierced with a large number of light transmitting portions 3c in the form of fine through-holes each having a diameter on the order of 20 μm at predetermined locations for allowing the laser beam B leaving the beam shaping optical system 13 to transmit therethrough for thereby forming a light image pattern corresponding to the mask pattern. As can be seen in FIG. 20, the mask 3 is adapted to be movable along the x- and y-directions, respectively, by means of the mask moving mechanism 4.

Disposed above the mask 3 is a high reflectivity mirror 2 in opposition thereto for directing the laser beam B reflected at the reflecting portion 3b toward the mask 3. On the other hand, the imaging lens 5 is disposed below the mask 3 with a workpiece 7 being disposed beneath the mask 3.

The workpiece 7 is fixedly mounted on a workpiece fixing platform 74 which in turn is adapted to be moved in the x- and y-directions, respectively, by means of a workpiece moving mechanism 6 mounted on a vibration-proof stationary platform 200. Operations of both the workpiece moving mechanism 6 and the mask moving mechanism 4 are controlled by a precision drive control system 201 which may be constituted by a correspondingly programmed computer. Further, positioning of the workpiece 7 and inspection of the holes as formed are effectuated through a processing monitor system 202.

Description will now turn to operation of the optical processing apparatus having the structure mentioned above.

Again referring to FIG. 21, a portion of light rays of the shaped laser beam B incident on the mask 3 at a lateral end portion thereof (at a right-hand side as viewed in the figure) obliquely from the above transmits through the light-transmitting portion 3c to form a light beam which contributes to the optical processing, while the other light rays are reflected by the reflecting portion 3b toward the high reflectivity mirror 2 which reflects the incident light rays again onto the mask 3. As can be seen in FIG. 21, the light rays which are reflected by the high reflectivity mirror 2 to be caused to impinge onto the mask 3 in succession are deviated from those impinging on the mask 3 in precedence in respect to the incident position relative to the mask 3. In other words, the flat laser beam B undergoes multiple reflections between the mask 3 and the high reflectivity mirror 2.

Owing to the repetitive or multiple reflections of the flat beam B between the mask 3 and the high reflectivity mirror 2, the intensity of the flat beam B is maintained, being protected against attenuation. The laser beam B transmitted through the light-transmitting portions 3c is focused onto the workpiece 7 via the imaging lens 5. As a result of this, the via-holes 7a are formed in the workpiece 7 in a pattern corresponding to that of the light-transmitting portions 3c of the mask 3.

At this juncture, it should be noted that the imaging lens 5 is realized by a high-performance lens system whose aberrations are suppressed to a possible maximum over a major region of the image plane in order to optically transfer or copy the pattern formed in the mask 3 onto the workpiece 7 with high accuracy. By way of example, in the case where the workpiece 7 is a multi-layer printed substrate, the size thereof is usually on the order of 100 mm×100 mm. Accordingly, when this area is to be optically processed in a single step, the lens system of extremely expensiveness has to be employed as the imaging lens 5.

Such being the circumstances, in the optical processing apparatus known heretofore, the optical processing over a large area of the workpiece 7 is realized by scanning both the mask 3 and the workpiece 7 with the laser beam, i.e., by effecting a so-called synchronous scanning of the mask 3 and the workpiece 7, as can be seen from FIG. 20.

By way of example, the when magnification M of the imaging lens 5 is "½", the mask 3 is scanned with the laser beam B laving a flat cross-section at a speed v in the direction x with the workpiece 7 being simultaneously scanned in the opposite direction (i.e., (−)x-direction) at a speed of v/2. Upon completion of the scanning in the x-direction, the workpiece 7 is displaced stepwise in the y-direction to perform again the scanning operation mentioned above. By repeating the scanning operation in this way, the whole surface of the workpiece 7 can optically be processed.

FIG. 23 shows another example of the optical processing apparatus known heretofore which is disclosed in "Hyoumen Jissou Gijutsu (Surface package Technique)" published by Nikkan Kogyou Shinbun-sha of Japan in January, 1992. In this known optical processing apparatus, a metal mask 31 having light transmitting portions 31a forming a pattern is employed as the mask for the same purpose as described above.

This known optical processing apparatus is designed to perform the optical processing or machining in a similar manner as in the case of the optical processing apparatus shown in FIG. 20.

More specifically, a laser beam A emitted from the excimer laser oscillator 11 is shaped into a collimated laser beam through a beam shaping optical system 13, wherein the mask 31 is illuminated with a flat beam B. The flat beam B transmitted through the light transmitting portions 31a of the mask 31 reaches a imaging lens 5, whereby a pattern of the light transmitting portions 31a is imaged onto a workpiece 7 under the optical action of the imaging lens 5. In this manner, ablasion processings such as formation of holes, grooves, marks and/or the like are realized.

The optical processing apparatus shown in FIG. 20 however suffers from problems mentioned below.

The problem to be first pointed out is that the magnification M of the imaging lens 5 is susceptible to variation from a designed value.

More specifically, when the optical processing is performed with an ultraviolet laser beam having a high intensity and likely to induce stress in a glass material as with the case of the laser beam generated by the excimer laser, the refractive index of the imaging lens 5 whose magnification is initially aligned most strictly or precisely will undergo variation in the course of use for an extended period, which brings about variation in the magnification, even though the variation is very small. Besides, upon exchange of the mask 3, the magnification may change because of positional deviation between the mask 3 and the imaging lens 5 due to variation in the thickness of the mask. Additionally, when the workpiece 7 is a multi-layer printed substrate, distance between the imaging lens 5 and the workpiece 7 will change in dependence on the numbers of wiring layers and insulation layers as stacked or superposed, which results in change in the thickness of the workpiece 7 and hence the distance between the imaging lens 5 and the workpiece 7, giving rise to variation in the magnification.

When the magnification M of the imaging lens 5 deviates from the designed value for the reasons mentioned above, geometrical shape and pattern of the holes formed in the workpiece 7 will be deformed even if magnitude of the deviation is extremely small.

By way of example, let's assume that the diameter of a pattern aperture formed in the mask 3 is 40 $\mu$m, diameter of the laser beam incident on the imaging lens 5 is 20 mm, the magnification M is "½" and that the synchronous scanning is effected in the x-direction. In that case, change of the magnification M by 0.1% will bring about deviation of the center position of the via-hole as formed by ±5 $\mu$m, as a result of which the hole as formed will be elongated by 10 $\mu$m from the desired diameter in the x-direction, as can be seen in FIG. 22.

Thus, in the optical processing apparatus known heretofore, deviation of the magnification from the designed value is unavoidably accompanied with distortion of the geometrical shape of the via-holes formed in the workpiece 7 as well as error in the positional accuracy of the via-holes. In other words, the optical processing apparatus known heretofore suffers a problem that the optical processing can not be carried out with high accuracy or precision as desired.

As an approach for coping with the problem mentioned above, there is conceivable such an arrangement in which the synchronous scanning is not resorted to. Even in that case, the hole position will still be deviated about 5 $\mu$m from the designed position on the assumption mentioned above. In this conjunction, it should be mentioned that in the case of a multi-layer printed substrate, the wiring pattern is formed by using an apparatus provided separately from the optical processing apparatus, and thus overall effect of error in both apparatuses will result in significant error with regards to the geometrical shape and positions of the holes as formed.

For solving the problems mentioned above, it may occur to those skilled in the art that when the laser beam B becomes out of focus, a light beam emitted from another light source is projected onto the imaging lens 5 at the incident side thereof to detect the light reflected at the workpiece 7 by a sensor for thereby realizing the focal point adjustment or alignment by making use of the output signal of the sensor.

However, in the optical processing apparatus in which the high-reflectivity mirror 2 is disposed above the mask 3 in the close vicinity thereof as in the case of the hitherto known optical processing apparatus, difficulty will be encountered in disposing the focus-aiding optical system mentioned above.

On the other hand, the optical processing apparatus shown in FIG. 23 is disadvantageous in the respects mentioned below.

In general, the workpiece 7 is formed of a high-molecular film such as polyimide, polyethylene or the like or a ceramic sheet which is also known as a green sheet in the art.

When the workpiece 7 is formed of a metrical mentioned above, the flat beam B having an energy density in a wide range of 0.5 to 10 (J/cm$^2$) is employed for processing the surface of the workpiece 7. Accordingly, when magnitude of the imaging lens 5 is constant, there may arise such situation in which the mask 31 has to be illuminated with the flat beam B of an intensity greater than a so-called injury threshold intensity which means a laser intensity capable of bringing about injury in the mask through a single-shot illumination.

Thus, when the flat laser beam B of the intensity higher than that of the injury threshold value of the mask 31 is used for illumination thereof, the mask 31 may be injured, incurring deformation of the pattern. Furthermore, when the mask 31 is formed of a dielectric material, reflectivity thereof will be lowered.

Besides, it should be appreciated that even when the intensity of the flat laser beam B is lower than the aforementioned injury threshold value, continuation of illumination of the mask 31 with the laser beam over an extended period will injure the mask 31. In an optical processing apparatus designed for a mass production where a large number of workpieces 7 have to be handled, it is required that the mask can withstand illumination not less than $10^9$ shots of laser beam. However, in the optical processing apparatus known heretofore, continuation of illumination of the 31 over an elongated period with a laser beam of intensity lower than the injury threshold value mentioned previously may injure the 31, degrading thereby the masking function, which is obviously disadvantageous for the manufacturing the desired devices on a mass production basis.

As the metal mask 31; there are known a stainless steel mask having the light transmitting portions 31a such as holes, slits and/or the like formed therein, a mask constituted by a glass substrate coated with chromium (Cr), aluminum (Al) or the like and patterned as desired. When the metal mask 31 of this type is employed, a large quantity of laser energy will be absorbed by the mask 31, as a result of which the mask will thermally be deformed in the course of extended use thereof, incurring degradation in the precision of patterning, to another disadvantage.

For coping with the problems mentioned above, it is conceivable to illuminate the 31 of the apparatus shown in FIG. 23 by using the laser beam B of significantly lower intensity than the injury threshold level for thereby protecting the mask against the injury while securing the energy level required for the surface processing by using the imaging lens 5 of a smaller magnification. However, in that case, the optical processing apparatus is necessarily to be implemented on a large size scale. Besides, because the distance b between the imaging lens 5 and the workpiece 7 (see FIG. 23) is necessarily to be short, the imaging lens 5 will become contaminated with sputtered material within a relatively short period, which is of course unfavorable to implementation of the optical processing apparatus desired for a mass production.

SUMMARY OF THE INVENTION

In the light of the state of the art described above, it is an object of the present invention to provide an optical processing apparatus for processing or treating optically a workpiece by using a light beam, which apparatus is capable of automatically adjusting a imaging magnification to a predetermined value and at the same time maintaining constant the imaging magnification regardless of exchange of masks and workpieces.

Another object of the present invention is to provide an optical processing apparatus of the type mentioned above which can ensure an extended use life of a mask while assuring a satisfactory mask function.

Yet another object of the present invention is to provide a method of automatically adjusting the imaging magnification in the optical processing apparatuses mentioned above.

In view of the above and other objects which will become apparent as the description proceeds, there is provided according to an aspect of the present invention an optical processing apparatus which includes a light source system for generating a light beam for illuminating a mask having a predetermined pattern, a imaging lens for transferring or copying a pattern image of the mask onto a workpiece, a mask moving mechanism for moving the mask in a direction perpendicular to an optical axis of the imaging lens, a workpiece moving mechanism for moving the workpiece in a direction perpendicular to the optical axis of the imaging lens, a imaging magnification changing mechanism for changing inter-mask/lens/workpiece distance between the mask, the imaging lens and the workpiece, and a central control unit, wherein the central control unit is comprised of an actual imaging magnification arithmetic module for determining arithmetically an actual imaging magnification value given in terms of a pattern ratio between the copied pattern image and the predetermined pattern of the mask, a magnification decision module for making decision whether or not a difference between the actual imaging magnification value and a desired imaging magnification value is smaller than a permissible value inclusive thereof, a z-axis (optical-axis) displacement control module for responsive to indication of the magnification decision module that the difference exceeds the permissible value, to thereby arithmetically determine on the basis of the actual imaging magnification value and the desired imaging magnification value the inter-mask/lens/workpiece distance at which the actual imaging magnification value becomes equal to the desired imaging magnification value for controlling thereby the imaging magnification changing mechanism so that the inter-mask/lens/workpiece distance coincides with the arithmetically determined distance, and a displacement control module for controlling the mask moving mechanism and the workpiece moving mechanism.

With the structure of the optical processing apparatus described above, the inter-mask/lens/workpiece distance at which the actual imaging magnification value coincides with the desired imaging magnification value can be arithmetically determined by the z-axis (optical-axis) displacement control module, whereupon the imaging magnification changing mechanism is so controlled that the actual inter-mask/lens/workpiece distance assumes the calculated value. Thus, even when the actual magnification of the imaging lens changes due to variation in the refractive index of the imaging lens or for other reasons, the desired imaging magnification can automatically be restored through the automatic adjustment. Accordingly, with the optical processing apparatus of the invention, the optical processing can be performed with significantly enhanced accuracy and precision when compared with the optical processing apparatus known heretofore.

In a preferred mode for carrying out the invention, the optical processing apparatus may further include a workpiece pattern observing device for viewing or observing the pattern image copied onto the workpiece, and an image processing unit for processing the pattern image picked up through the workpiece pattern observing device, wherein the actual imaging magnification arithmetic module of the central processing unit arithmetically determines the actual imaging magnification value on the basis of information concerning the pattern image supplied from the image processing unit.

With the structure of the optical processing apparatus described above, the actual imaging magnification value can be measured with very high accuracy.

In another mode for carrying out the invention, the workpiece pattern observing device may be constituted by a magnifying lens for magnifying the pattern image, and a two-dimensional CCD camera for picking up the magnified pattern image.

Owing to the arrangement mentioned above, the actual imaging magnification value can be measured speedily with high accuracy.

In yet another preferred mode for carrying out the invention, the imaging magnification changing mechanism may include at least two of z-axis (optical-axis) mask moving mechanism for moving the mask in the direction of the optical axis, z-axis (optical-axis) imaging lens moving mechanism for moving the imaging lens in the direction of the optical axis and z-axis (optical-axis) workpiece moving mechanism for moving the workpiece in the optical axis, and wherein the z-axis (optical-axis) displacement control module of the central control unit controls two given ones of the z-axis mask moving mechanism, the z-axis imaging lens moving mechanism and the z-axis workpiece moving mechanism to thereby cause the inter-mask/lens/workpiece distance to coincide with the arithmetically determined distance value.

The arrangement described above is advantageous in that the imaging magnification can be adjusted without exerting any appreciable adverse influence to the image focusing performance of the imaging lens.

In still another preferred mode for carrying out the invention, the mask may have a test pattern including at least two marks, wherein the actual imaging magnification arithmetic module of the central control unit may arithmetically determine a ratio between a distance between the images of the marks copied onto the workpiece and an actual distance between the marks, which ratio represents the actual imaging magnification value.

With the arrangement mentioned above, the actual imaging magnification value can be measured with high accuracy.

In a further preferred mode for carrying out the invention, the mask may have a test pattern including a single hole of a predetermined shape, wherein the actual imaging magnification arithmetic module of the central control unit may arithmetically determine as the actual imaging magnification value a ratio between the size of an image of the hole copied onto the workpiece and an actual size of the hole of the mask.

By virtue of the above arrangement, there can be attained an advantage that adjustment of the imaging magnification can be accomplished with the aid of the test pattern of a very simple structure.

In a further preferred mode for carrying out the invention, the optical processing apparatus may further include at least two of a synchronous mask moving mechanism for moving the mask in the direction perpendicular to the optical axis of the imaging lens a synchronous imaging lens moving mechanism for moving the imaging lens in the direction perpendicular to the optical axis thereof, and a synchronous workpiece moving mechanism for moving the workpiece in the direction perpendicular to the optical axis of the imaging lens, wherein upon illumination of the mask with the light beam, the displacement control module controls two of the synchronous mask moving mechanism, the synchronous imaging lens moving mechanism and the synchronous workpiece moving mechanism to thereby cause either a combination of the mask and the imaging lens or a combination of the imaging lens and workpiece or a combination of the mask and the workpiece to move synchronously in opposite directions, respectively, at a speed ratio corresponding to the desired imaging magnification value.

The optical processing apparatus of the above-mentioned structure is profitable and advantageous in that a workpiece even of a very large area can be processed satisfactorily.

In a yet further preferred mode for carrying out the invention, the synchronous movement mentioned above may be effected only in one direction, wherein the actual imaging magnification arithmetic module of the central control unit arithmetically determines the actual imaging magnification value as a ratio between the size of a pattern hole image copied onto the workpiece during the synchronous movement and an actual size of the pattern hole of the mask.

Owing to the above arrangement, the adjustment of the imaging magnification can be effected without using the mask provided for the test purpose so long as the size of the hole of a mask to be actually used is known.

In a preferred mode for carrying out the invention, the synchronous mask moving mechanism may serve also for the function of the mask moving mechanism with the synchronous workpiece moving mechanism serving also for the function of the workpiece moving mechanism.

This arrangement is advantageous in that the optical processing apparatus can be manufactured in a simplified structure at low cost.

In another preferred mode for carrying out the invention, the workpiece may have an alignment mark which is so positioned as to coincide with a center of an image plane of the copied pattern observing device when the workpiece is displaced by the workpiece moving mechanism in the state in which the workpiece is fixedly disposed.

The arrangement described above is advantageous in that the device to be dedicated for measurement of the alignment mark can be spared, whereby the optical processing apparatus can be implemented inexpensively.

In another preferred mode for carrying out the invention, the optical processing apparatus may include a mask holder for holding the mask in the state in which the mask pattern surface is disposed at a predetermined position, and a workpiece holder for holding the workpiece in the state in which a surface of the workpiece to be processed is disposed at a predetermined position.

With the above structure of the optical processing apparatus, the imaging magnification can be protected against variation even when the thickness of the mask and/or workpiece changes due to exchange thereof. Thus, there arises no necessity of performing the adjustment of the imaging magnification after exchange of the mask and/or the workpiece, which in turn means that the optical processing can be performed smoothly and speedily with high efficiency, to a great advantage.

According to another aspect of the present invention, there is provided the optical processing apparatus which includes a light source, a mask provided with light transmitting portions for allowing a light beam emitted from the light source to pass therethrough and a light reflecting portion for reflecting the light beam, a reflecting means disposed in opposition to the light transmitting portion for directing light rays reflected at the light reflecting portion toward the mask, a workpiece to be optically processed, a imaging lens for copying a pattern formed by light rays transmitted through the mask onto the workpiece, a means for moving two of the mask, the imaging lens and the workpiece in parallel with each other in a direction orthogonally to the optical axis of the imaging lens to thereby process optically the workpiece, a mask holder for holding the mask in the state in which a pattern surface of the mask is disposed at a predetermined position, and a workpiece holder for holding the workpiece in the state in which a surface of the workpiece to be processed is disposed at a predetermine position.

With the above structure of the optical processing apparatus, the imaging magnification can be protected against variation even when the thickness of the mask and/or workpiece changes upon exchange thereof. Thus, there arises no necessity of performing the adjustment of the imaging magnification after exchange of the mask and/or the workpiece, which in turn means that the optical processing can be performed smoothly and speedily with high efficiency, to a great advantage.

In yet another preferred mode for carrying out the invention, the mask may have a predetermined thickness and mounted on the mask holder in such disposition that the pattern surface of the mask faces toward the imaging lens.

With the above arrangement, the light energy utilization efficiency can be improved, whereby the optical processing can be performed at an increased speed.

In still another preferred mode for carrying out the invention, the mask holder may be provided with a test pattern formed either by at least two marks or a single hole of a predetermined shape.

By virtue of this arrangement, the adjustment of the imaging magnification can fully be automated.

In a further preferred mode for carrying out the invention, the workpiece holder may include urging a means for urging the workpiece toward the imaging lens, and a retaining member for retaining the workpiece at a surface which is to be processed and which faces toward the imaging lens.

With the structure mentioned above, the workpiece holder can be realized inexpensively, whereby the manufacturing cost of the optical processing apparatus can correspondingly be lowered.

In a still further preferred mode for carrying out the invention, the optical processing apparatus may further include a workpiece height measuring device for measuring a position of the workpiece in the direction of the optical axis.

Owing to provision of the workpiece height measuring device, the position of the workpiece along the optical axis can be measured with high accuracy even when deformation or distortion should occur in the workpiece. Thus, the precision or accuracy of the optical processing can be increased.

In a yet further preferred mode for carrying out the invention, the workpiece height measuring device may be constituted by either a laser-type length measuring device or a contact-type length measuring device.

With this arrangement, the accuracy of the optical processing can further be improved.

In another preferred mode for carrying out the invention, the workpiece height measuring device may be so designed as to detect a focused state of a pattern image of the mask projected onto the workpiece, wherein the z-axis (optical-axis) displacement control module of the central control unit controls the z-axis (optical-axis) workpiece moving mechanism so that the workpiece is positioned at a position at which the patten image is focused.

Owing to this arrangement, the workpiece height measuring device can be implemented in a simplified structure, which contributes to reduction of manufacturing cost of the optical processing apparatus as s whole.

In another preferred mode for carrying out the invention, the light source system may be comprised of an excimer laser system.

By using the excimer laser as the light source system, fine optical processing of workpieces can be carried out.

In yet another preferred mode for carrying out the invention, the workpiece may be constituted by a green sheet for a multi-layer printed substrate containing polyimide or ceramic to be fired under illumination of the light beam.

The optical processing apparatus of this structure makes it possible to optically process even a high-density multi-layer printed substrate.

In still another preferred mode for carrying out the invention, a position detector may be disposed in association with the workpiece moving mechanism for detecting displacement of the workpiece.

With this structure of the optical processing apparatus, the distance between the mark images and the size of the holes image can be measured with high accuracy, whereby the actual imaging magnification value can be measured with very high accuracy.

The invention is also directed to a method of adjusting a imaging magnification in the optical processing apparatuses described above. Thus, according to another aspect of the present invention, there is provided a method of adjusting a imaging magnification, which method is comprised of a first moving step of moving the workpiece by means of the workpiece moving mechanism to thereby position mark images of the test pattern mentioned previously at a viewing position of the copied pattern observing device, a first arithmetic step of observing the mark images through the copied pattern observing device to thereby determine arithmetically deviation of the mark images from a center of the image plane of the copied pattern observing device with aid of the image processing unit, a second moving step of moving the workpiece by means of the workpiece moving mechanism to thereby displace the mark images toward the center of the image plane by a distance corresponding to the deviation, a second arithmetic step of observing the mark images moved toward the center of the image plane through the copied pattern observing device to arithmetically determine deviation of the mark images from the center by the image processing unit, a third moving step of moving the workpiece by the workpiece moving mechanism so that the mark images are displaced toward the center of the image plane by a distance corresponding to the deviation determined in the second arithmetic step, and a distance arithmetic step of arithmetically determining total displacements of the mark images, respectively, as detected by a position detecting means to thereby determine a distance between the at least two mark images on the basis of difference between the total displacements.

The method described above allows the actual imaging magnification value to be measured with high accuracy, making it possible to adjust the imaging magnification with high accuracy.

In another preferred mode for carrying out the invention, the mask may be comprised of a light-transmissive substrate, a dielectric thin film formed on the light-transmissive substrate by depositing alternately two different dielectric materials differing from each other in respect to refractive index, and a pattern formed extending through the dielectric thin film, while the light source system may be constituted by a laser device capable of illuminating the dielectric thin film of the mask with a laser beam having an energy density falling within a range of 300 to 500 mJ/cm$^2$, wherein the imaging magnification value is set in accordance with energy density optimal for effecting ablasion processing on the WP.

With the arrangement described above, there can be ensured an optimal processing light energy demanded on the surface of a workpiece to be processed through the illumination of the laser beam having rather low illumination energy density. Thus, the use life of the mask can be extended while ensuring a high quality for the workpiece as processed.

In another preferred mode for carrying out the invention, the desired imaging magnification value may be given either by a demanded imaging magnification value required for copying with an optimal energy density within a range of 300 to 500 mJ/cm$^2$ or a recommendable imaging magnification for copying with a minimum energy density of 300 mJ/cm$^2$.

Owing to this arrangement, the workpiece obtained as the result of the optical processing can enjoy a further improved quality.

In still another preferred mode for carrying out the invention, a high-reflectivity mirror may be disposed in opposition to the dielectric thin film of the mask so that multi-reflection of the light beam takes places between the high-reflectivity mirror and the dielectric thin film.

With this structure, the mask can be illuminated with the laser beam with a high efficiency.

In a further preferred mode for carrying out the invention, the light-transmissive substrate of the mask may be formed either of synthetic quartz glass or fluorite. Further, of the two dielectric thin films, the dielectric material having a higher refractive index may be formed either of hafnium oxide or scandium oxide, while the dielectric material having a lower refractive index may be formed either of silicon oxide or magnesium fluoride, wherein the dielectric materials of high refractive index and low refractive index may be stacked in 20 to 30 laminae.

With this arrangement, the multi-reflection by the mirror of high reflectivity can be realized with a high efficiency without incurring any significant loss in the laser beam energy used actually for optically processing the workpiece.

In a still further preferred mode for carrying out the invention, the optical processing apparatus which uses the mask formed with a reference light beam transmitting portion at a predetermined location of the dielectric thin film for allowing a portion of the laser beam to pass therethrough may further include a first laser intensity sensor for detecting intensity of the laser beam having passed through the reference light transmitting portion.

With the structure of the optical processing apparatus described above, not only the reliability of the optical processing but also the utilization efficiency of the high beam energy in the optical processing can be improved.

In a yet further preferred mode for carrying out the invention, a second laser intensity sensor may be provided for detecting the intensity of the laser beam with which the surface of the workpiece to be processed is illuminated.

With the structure of the optical processing apparatus described above, not only the reliability of the optical processing but also the utilization efficiency of the high beam energy in the optical processing can equally be improved.

In a further preferred mode for carrying out the invention, the laser beam may be emitted by a KrF-laser and have a wavelength of 248 nm.

By using the KrF-laser as the light source system, absorption of energy of the light beam in the course of transmission in the air can be suppressed to a minimum, whereby the optical processing can be carried out without being restricted by environmental condition.

In a still further preferred mode for carrying out the invention, there is provided a method of optically processing a workpiece, which method is comprised of a step of copying a pattern of the mask onto the workpiece by way of a imaging lens having a focal length capable of realizing theoretically the demanded imaging magnification and the recommendable imaging magnification, and a step of adjusting the imaging magnification so that the actual imaging magnification value coincides with the desired imaging magnification value.

With this arrangement, the imaging magnification can be adjusted with high accuracy even in the case where the z-axis imaging lens moving mechanism and the z-axis workpiece moving mechanism are limited in respect to the distance over which they are moved.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIG. 18 is a view for illustrating in the form of a table relations which exist among optimal processing energy densities, demanded imaging magnifications and recommendable imaging magnifications;

DESCRIPTION OF THE PREFERRED EMBODIMENTS

Figure 1:
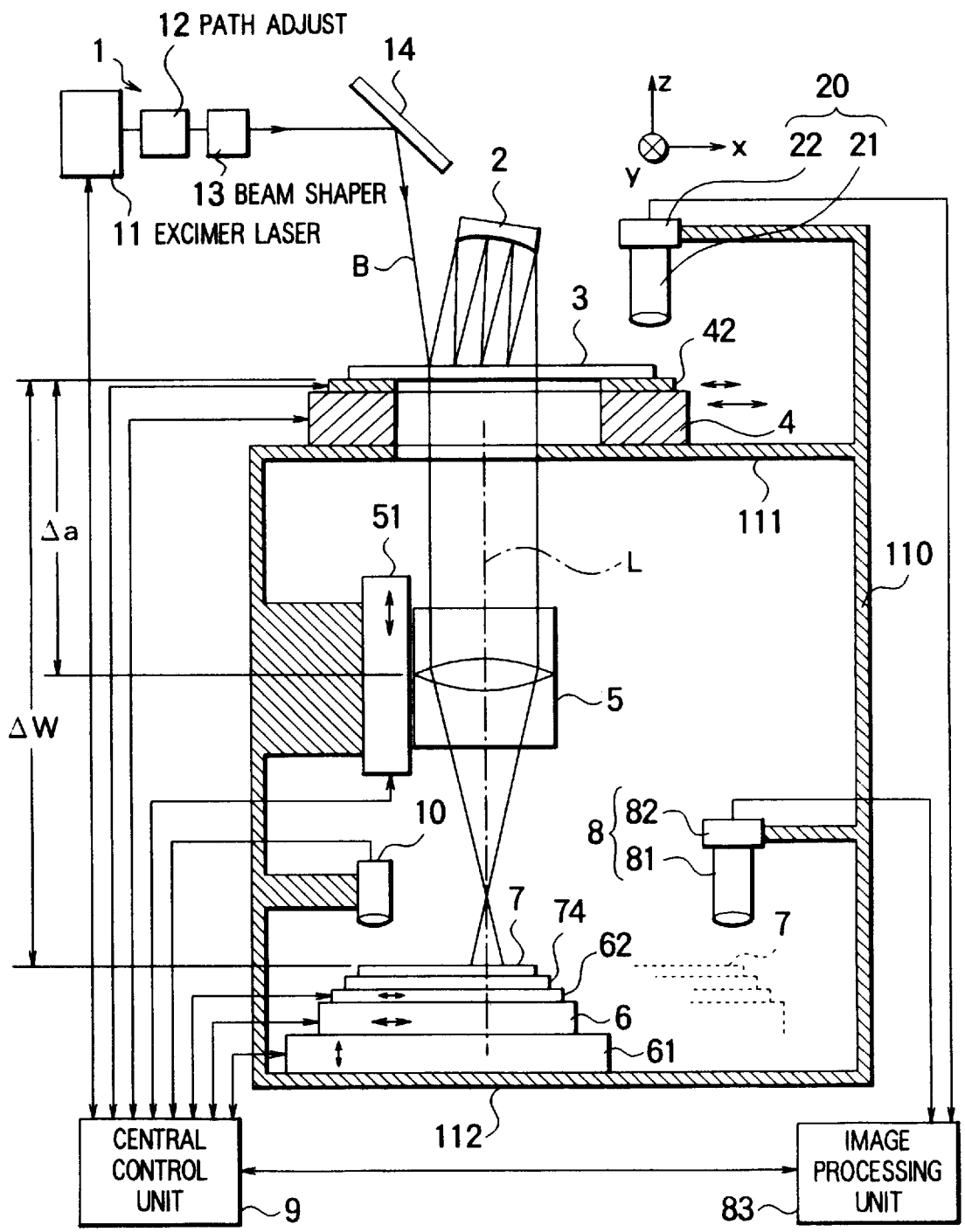
FIG. 1 is a diagram showing schematically a structure of an optical processing apparatus according to a first embodiment of the present invention.

Now, the present invention will be described in detail in conjunction with what is presently considered as preferred or typical embodiments thereof by reference to the drawings. In the following description, like reference characters designate like or corresponding parts throughout the several views. Also in the following description, it is to be understood that such terms as "left", "right", "vertical", "horizontal", "top", "bottom", "upper", "lower", "upwardly", "downwardly" and the like are words of convenience and are not to be construed as limiting terms.

Embodiment 1

Figure 20:
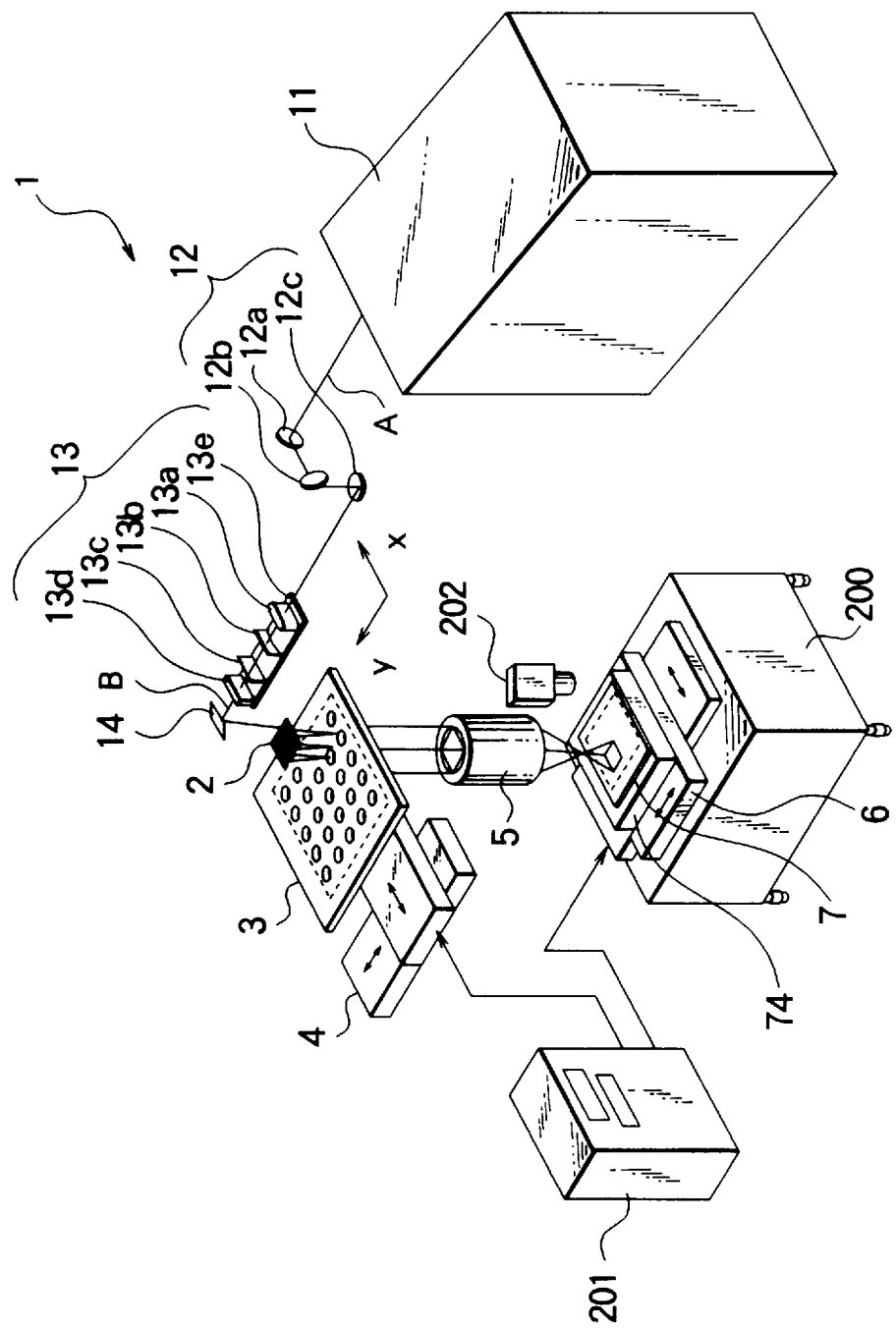
FIG. 20 shows a typical one of optical processing apparatuses known heretofore.
Figure 21:
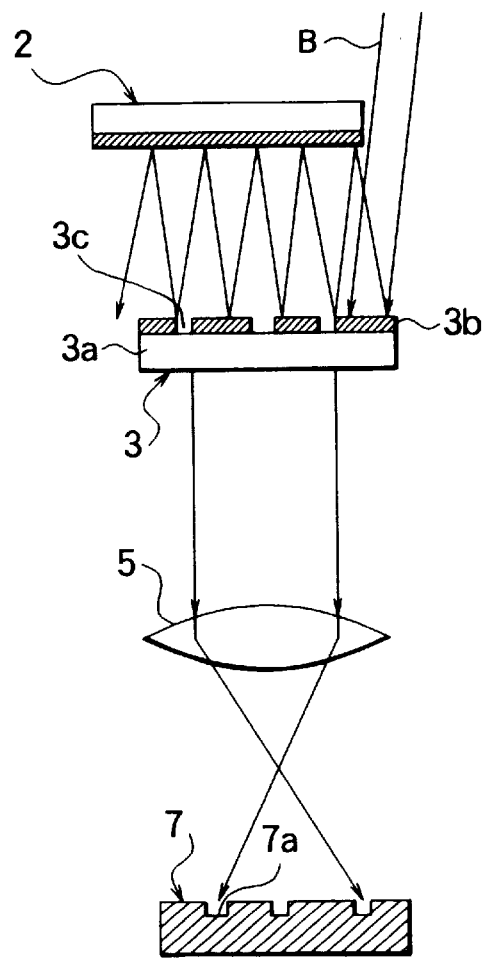
FIG. 21 is a schematic view for illustrating a pattern copying operation in the optical processing apparatus known heretofore.

FIG. 1 is a diagram illustrating schematically a structure of an optical processing apparatus according to a first embodiment of the present invention. In FIG. 1, the same or like elements as those used in the description of the related art by reference to shown in FIG. 20 are denoted by the same reference symbols as used in FIG. 20.

Referring to FIG. 1, the optical processing apparatus according to the instant embodiment of the invention is comprised of a light source system 1 (which in turn is composed of an excimer laser oscillator 11, a beam path adjusting system 12, a beam shaping optical system 13 and an incident angle adjusting mirror 14) for illuminating a mask 3 with a flat laser beam B obtained by shaping correspondingly the laser beam emitted from the excimer laser oscillator 11, a mask moving mechanism 4 and a synchronous mask moving mechanism 42 for moving the mask 3 in a direction perpendicular to an optical axis L (i.e., in the x-direction), a imaging lens 5 for copying a pattern image of the mask 3 to a workpiece 7, a workpiece moving mechanism 6 and a synchronous workpiece moving mechanism 62 for moving the workpiece 7 in the direction perpendicular to the optical axis L (i.e., in the x-direction), a imaging magnification changing mechanism (51; 61) for changing a distance between the mask 3 and the workpiece 7 by moving the imaging lens 5 and the workpiece 7 in the direction parallel to the optical axis L (which is also referred to as the z-axis), a copied pattern observing device 8 for observing or viewing and/or picking up a pattern image formed on the workpiece 7 for visual inspection thereof, an image processing unit 83 for processing the pattern image picked up through the copied pattern observing-device 8 and a central control unit 9 which is in charge of controlling of operating of the apparatus as a whole and adapted to perform data processing and arithmetic operation as required. To this end, the central control unit may be constituted by a computer.

Figure 2:
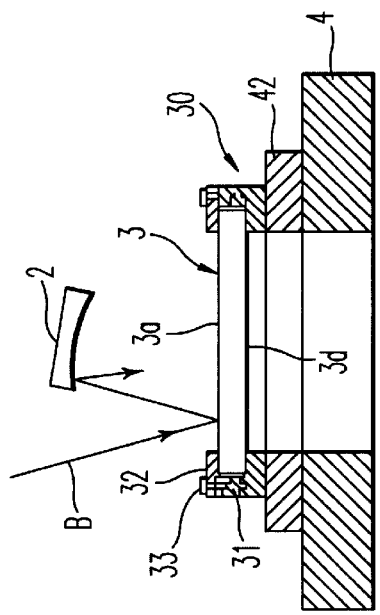
FIG. 2 is a sectional view showing a mask holder used in the optical processing apparatus shown in FIG. 1.

The mask 3 is held by a mask holder 30 which is constituted by a lower holding member 31a dapted to be fixedly secured to the synchronous mask moving mechanism 42 and a top cover 32, as shown in FIG. 2. The lower holding member 31 is punched in the form of a frame so that the mask 3 can be fit therein while allowing a laser beam B to pass therethrough. More specifically, the mask 3 is fit onto the lower holding member 31 in a surface contact state with a patterned surface 3d thereof facing downwardly (i.e., in the direction opposite to the side at which a high reflectivity mirror 2 is disposed). The top cover 32 is then mounted on the mask 3 and secured by screws 33.

With the mask mounting structure described above, the distance between the mask 3 and the imaging lens 5 in the optical processing apparatus shown in FIG. 1 is determined by a distance existing between the patterned surface 3d and a major plane of the imaging lens 5. Accordingly, if the mask 3 is so disposed that the patterned surface 3d thereof faces upwardly, it will then become difficult to copy the mask pattern with high precision or accuracy because the distance between the mask 3 and the imaging lens 5 changes in dependence on variation in the thickness of the light-transmissive substrate 3a which may occur upon exchange of the mask 3.

In contrast, by mounting the mask 3 on the mask holder 30 with the patterned surface 3d thereof facing downwardly, as described previously, the distance between the mask 3 and the imaging lens 5 can always be maintained to be constant, allowing the pattern copying or pattern transfer to be executed with high accuracy regardless of use of the masks 3 having the light-transmissive substrates 3a which differ from one to another, because the patterned surface 3d is always positioned by the lower holding member 31.

The mask holder 30 in turn is fixedly secured to the mask moving mechanism 4 through the medium of the synchronous mask moving mechanism 42, the function of which will be described later on.

The mask moving mechanism 4 includes an x-y table which is mounted on a top surface 111 of a stationary support 110 in a disposition perpendicular to the optical axis of the imaging lens, as shown in FIG. 1 and adapted to move the mask holder 30 in union with the synchronous mask moving mechanism 42 in x- and y-directions under the control of the central control unit 9. Parenthetically, in the optical processing apparatus shown in FIG. 1, it is assumed that the z-axis direction coincides with that of the optical axis L.

On the other hand, the synchronous mask moving mechanism 42 is so implemented as to move the mask 3 in the x- and y-directions in synchronism with displacement of the workpiece 7 and serves for effecting a fine positional adjustment of the mask 3. Accordingly, the optical axis will sometimes be referred to as the z-axis.

The imaging lens 5 is constituted by an optical lens system for copying or projecting a pattern image of the mask 3 onto the workpiece 7 and is mounted on the stationary support 110 through the medium of the z-axis lens moving mechanism 51 which is designed to move the imaging lens in the z-axis direction which coincides with or extended in parallel with the optical axis L. Incidentally, it should be mentioned that the imaging lens 5 is implemented as a telecentric system which has a focal length f of 150 mm, an effective aperture (angle of view) of 20 mm and a designed magnification M of 0.5000 (=½).

The imaging magnification changing mechanism (51; 61) is comprised of the aforementioned z-axis lens moving mechanism 51 and a z-axis workpiece moving mechanism 61 which is designed for moving the workpiece 7 in the z-direction coinciding with the optical axis L and which is mounted on a bottom wall 112 of the stationary support 110.

The workpiece moving mechanism 6 mentioned previously is mounted on the z-axis workpiece moving mechanism 61.

More specifically, the workpiece moving mechanism 6 includes an x-y table which is mounted on the z-axis workpiece moving mechanism 61 in the disposition perpendicular to the optical axis L of the imaging lens and adapted to move the workpiece 7 in union with the synchronous workpiece moving mechanism 62 in the x- and y-directions under the control of the central control unit 9.

The workpiece moving mechanism 6 is provided with a position detector (not shown) for detecting the positional displacement of the workpiece 7. The position detector may inexpensively be constituted by a rotary encoder provided in association with an output shaft of an electric motor employed as a driving source for moving the workpiece moving mechanism 6. However, in the case of the optical processing apparatus according to the instant embodiment of the invention, the position detector is implemented in the form of a high-precision instrument such a linear scale or the like mounted on the x-y table constituting the workpiece moving mechanism 6 with a view to making it possible to measure the displacement of the workpiece 7 with a high resolution on the order of 1 $\mu$m or less.

The synchronous workpiece moving mechanism 62 is designed to effect a fine positional adjustment of the workpiece 7 in the x- and/or y-directions in synchronism with the displacement of the mask 3. The workpiece 7 is fixedly secured on a workpiece fixing mount 74 which in turn is mounted on the synchronous workpiece moving mechanism 62. The pattern image copied or transferred onto the workpiece 7 can be viewed through a copied pattern observing device generally denoted by a numeral 8.

The copied pattern observing device 8 is comprised of a magnifying lens 81 for magnifying the pattern image projected onto the workpiece 7 and a two-dimensional CCD (charge coupled device) camera 82 for picking up the magnified pattern image.

On the other hand, provided in association with the mask 3 a mask pattern observing device 20 which is composed of a magnifying lens 21 for magnifying the pattern of the mask 3 and a two-dimensional CCD (charge coupled device) camera 22 for picking up the magnified pattern image of the mask 3.

The image processing unit 83 is designed for processing the signals supplied from the two-dimensional CCD cameras 22 and 82 to thereby output the image information resulting from the image processing to the central control unit 9.

The central control unit 9 is in charge of controlling the excimer laser oscillator 11 of the light source system 1, the mask moving mechanism 4 and the synchronous mask moving mechanism 42, the imaging magnification changing mechanism (51; 61), the workpiece moving mechanism 6 and the synchronous workpiece moving mechanism 62, and the image processing unit 83.

Figure 3:
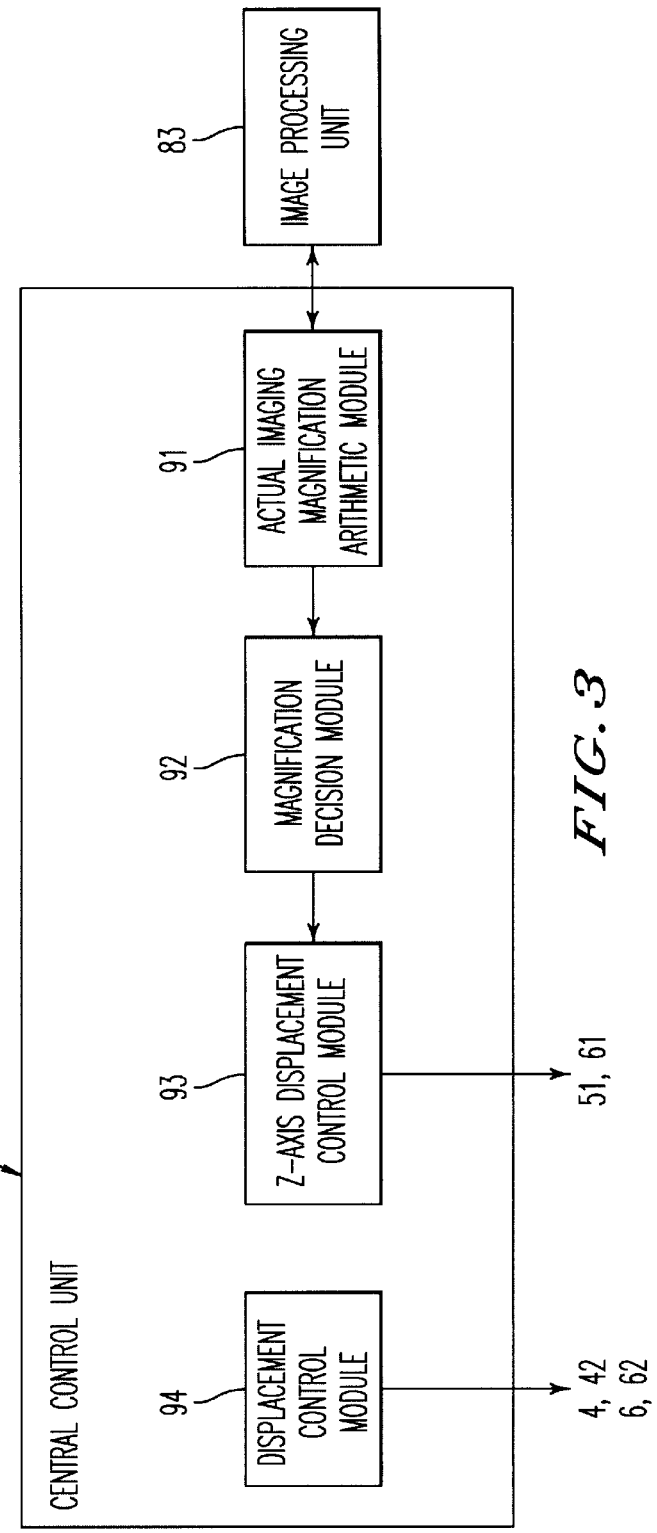
FIG. 3 is a block diagram showing schematically and generally a configuration of a central processing unit of the optical processing apparatus shown in FIG. 1.

More specifically, the central control unit 9 incorporates therein an actual imaging magnification arithmetic module 91, a magnification decision module 92 and a z-axis displacement control module 93, as shown in FIG. 3.

The actual imaging magnification arithmetic module 91 is designed to determine arithmetically an actual imaging magnification value M' which represents a ratio of the pattern image on the workpiece 7 and that of the mask 3 on the basis of the pattern image information supplied from the image processing unit 83. On the other hand, the magnification decision module 92 serves to decide whether or not a difference between the actual imaging magnification value M' determined by the actual imaging magnification arithmetic module 91 and a desired imaging magnification value M (designed magnification value of the imaging lens 5) falls within a range of permissible values $\delta$.

When it is decided by the magnification decision module 92 that the difference mentioned above exceeds the permissible value range $\delta$, the z-axis displacement control module 93 determines arithmetically or calculates the distances between the mask, the imaging lens and the workpiece so that the actual imaging magnification value M' becomes equal to the desired imaging magnification value M on the basis of the current actual imaging magnification value M' to thereby control the imaging magnification changing mechanism (51; 61) so that the actual distances between the mask 3, the imaging lens 5 and the workpiece 7 coincide with the arithmetically determined distance values. More specifically, referring to FIG. 2, the z-axis displacement control module 93 calculates a mask-to-lens distance $\Delta a$ between the mask 3 and the imaging lens 5 and controls the imaging lens 51 so that the actual distance between the mask 3 and the imaging lens 5 coincides with the calculated mask-to-lens distance $\Delta a$. Additionally, the z-axis displacement control module 93 calculates a mask-to-workpiece distance $\Delta w$ between the mask 3 and the workpiece 7 and controls the z-axis workpiece moving mechanism 61 so that the actual distance between the mask 3 and the workpiece 7 coincides with the calculated mask-to-workpiece distance $\Delta w$.

A displacement control module 94 incorporated in the central control unit 9 is in charge of controlling the mask moving mechanism 4 and the synchronous mask moving mechanism 42 on one hand and the workpiece moving mechanism 6 and the synchronous workpiece moving mechanism 62 on the other hand, as is illustrated in FIG. 3. Furthermore, as shown in FIG. 1, the displacement control module 94 is imparted with a function for controlling the mask moving mechanism 4 and the workpiece moving mechanism 6 so that alignment marks on the mask 3 and the workpiece 7 are positioned at centers of images generated on the mask pattern observing device 20 and the copied pattern observing device 8, respectively, when the mask 3 and the workpiece 7 as positioned are displaced by a predetermined distance to the mask pattern observing device 20 and the copied pattern observing device 8, respectively. Accordingly, when the alignment marks are deviated from the centers of the images generated on the mask pattern observing device 20 and the copied pattern observing device 8, respectively, this means that the mask 3 and the workpiece 7 are not positioned accurately.

More particularly, in the optical processing where holes are to be formed in a multi-layer printed substrate, it is required to position precisely the masks 3 and the workpieces 7 upon exchange thereof because of necessity for alignment of positions of the holes among the layers with high accuracy.

In this conjunction, in the case of the optical processing apparatus according to the instant embodiment of the invention, it is presumed that the alignment marks on the mask 3 and the workpiece 7 are detected by using the magnifying lenses 21 and 81 each having a magnification of "5" and the two-dimensional CCD cameras 22 and 82 of "0.5" inch size. Since the inter-pixel pitch in the two-dimensional CCD cameras 22 and 82 is about 2 $\mu$m, the inter-pixel pitch is equivalently equal to about 10 $\mu$m when the magnifying lenses 21 and 81 each of magnification of "5" are employed.

By performing average and projection processing on the signals outputted from the two-dimensional CCD cameras 22 and 82 in the image processing unit 83, the alignment resolution assumes a value on the order of 0.2 µm which is smaller than the inter-pixel pitch. Thus, with the aid of the mask pattern observing device 20 and the copied pattern observing device 8, it can be determined whether or not the mask 3 and the workpiece 7 are positioned with high accuracy.

Furthermore, in the optical processing apparatus according to the instant embodiment of the invention, a workpiece height measuring device 10 is provided for measuring the height of the workpiece 7 in the direction coinciding with the optical axis L. The workpiece height measuring device 10 is implemented as a laser-based length or distance measuring device. On the basis of the measurement information available from the output of the workpiece height measuring device 10, the z-axis displacement control module 93 incorporated in the central control unit 9 controls the z-axis workpiece moving mechanism 61.

Now, description will turn to operation of the optical processing apparatus according to the instant-embodiment of the invention.

In order to automatically adjust the magnification of the imaging lens 5 to a target or desired imaging magnification value by inspecting whether or not the magnification of the imaging lens 5 has changed, operation described below is first carried out by using a test-dedicated mask 3-1 shown in FIG. 5.

Figure 5:
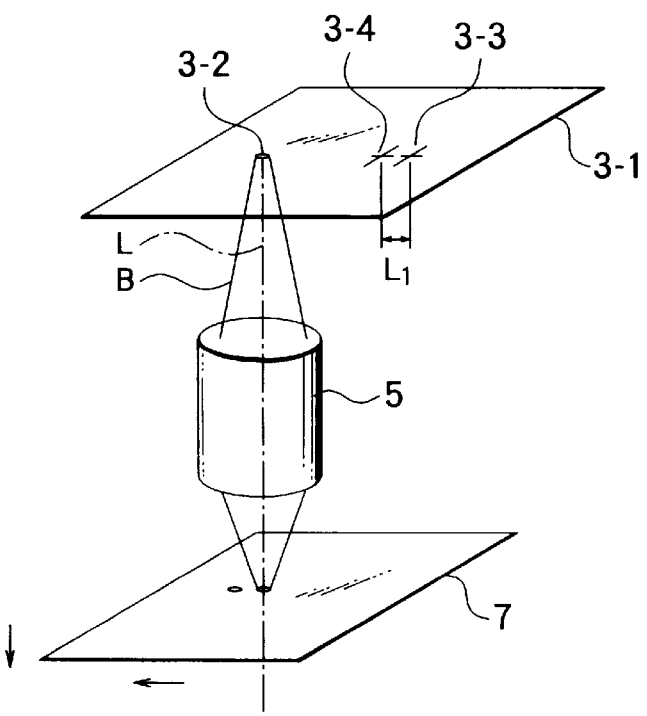
FIG. 5 is a pictorial view for illustrating a focusing operation in the optical processing apparatus shown in FIG. 1.

The test-dedicated mask 3-1 has a single through-hole 3-2 and a test pattern composed of a pair of cross-line reticles 3-3 and 3-4, as can be seen in FIG. 5. The through-hole 3-2 is a circular hole having a diameter of 20 µm. Further, each of the cross-line reticles 3-3 and 3-4 has a line length of 0.5 mm and a line width of 100 µm, wherein the inter-reticle distance $L_1$ between the cross-line reticles 3-3 and 3-4 is 10.000 mm.

The test-dedicated mask 3-1 is mounted on the mask holder 30 in such a manner as illustrated in FIG. 2, while the workpiece 7 is fixedly disposed on the workpiece fixing mount 74.

Subsequently, focusing adjustment operation for the imaging lens 5 is performed. At first, the mask moving mechanism 4 is so controlled that the through-hole 3-2 is positioned on the optical axis L, as illustrated in FIG. 5, whereupon the test-dedicated mask 3-1 is illuminated with the laser beam B emitted from the excimer laser oscillator 11 constituting a major part of the light source system 1.

Subsequently, the z-axis workpiece moving mechanism 61 is fed stepwise (i.e., in a step-by-step manner) in the vicinity of the focal point of the imaging lens 5 under the control of the z-axis displacement control module 93 incorporated in the central control unit 9, to thereby form the images of the through-hole 3-2 in the workpiece 7 upon every stepwise displacement of the z-axis workpiece moving mechanism 61. Then, the images of the holes formed in the workpiece 7 through the optical processing are picked up by the two-dimensional CCD camera 82 by way of the magnifying lens 81 to thereby allow the image processing unit 83 to calculate the diameters of the hole images. Thereafter, the height of the workpiece 7 at which the hole having a shortest diameter is formed is selectively determined.

Figure 6:
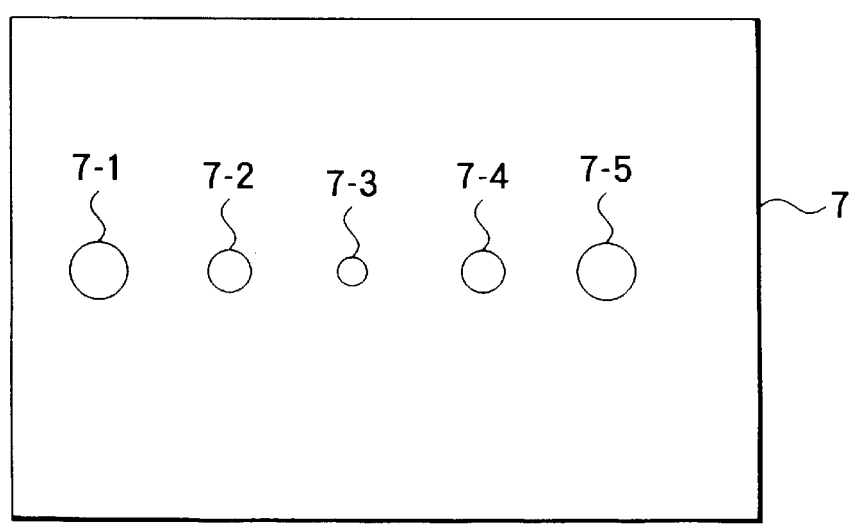
FIG. 6 is a top plan view showing images of a hole copied to a workpiece.

In more concrete, of the circular holes 7-1 to 7-5 formed in the workpiece 7, as shown in FIG. 6, the circular hole 7-3 of the shortest diameter is selected indicating as the position of the workpiece 7 in the direction of the optical axis L which corresponds to the focal point of the imaging lens 5, whereupon the z-axis workpiece moving mechanism 61 is so controlled that the workpiece 7 assumes the above-mentioned position.

Thereafter, a imaging magnification adjusting operation is performed, which will be described below by reference to FIG. 4 which is a flow chart for illustrating the magnification adjusting operation.

Figure 4:
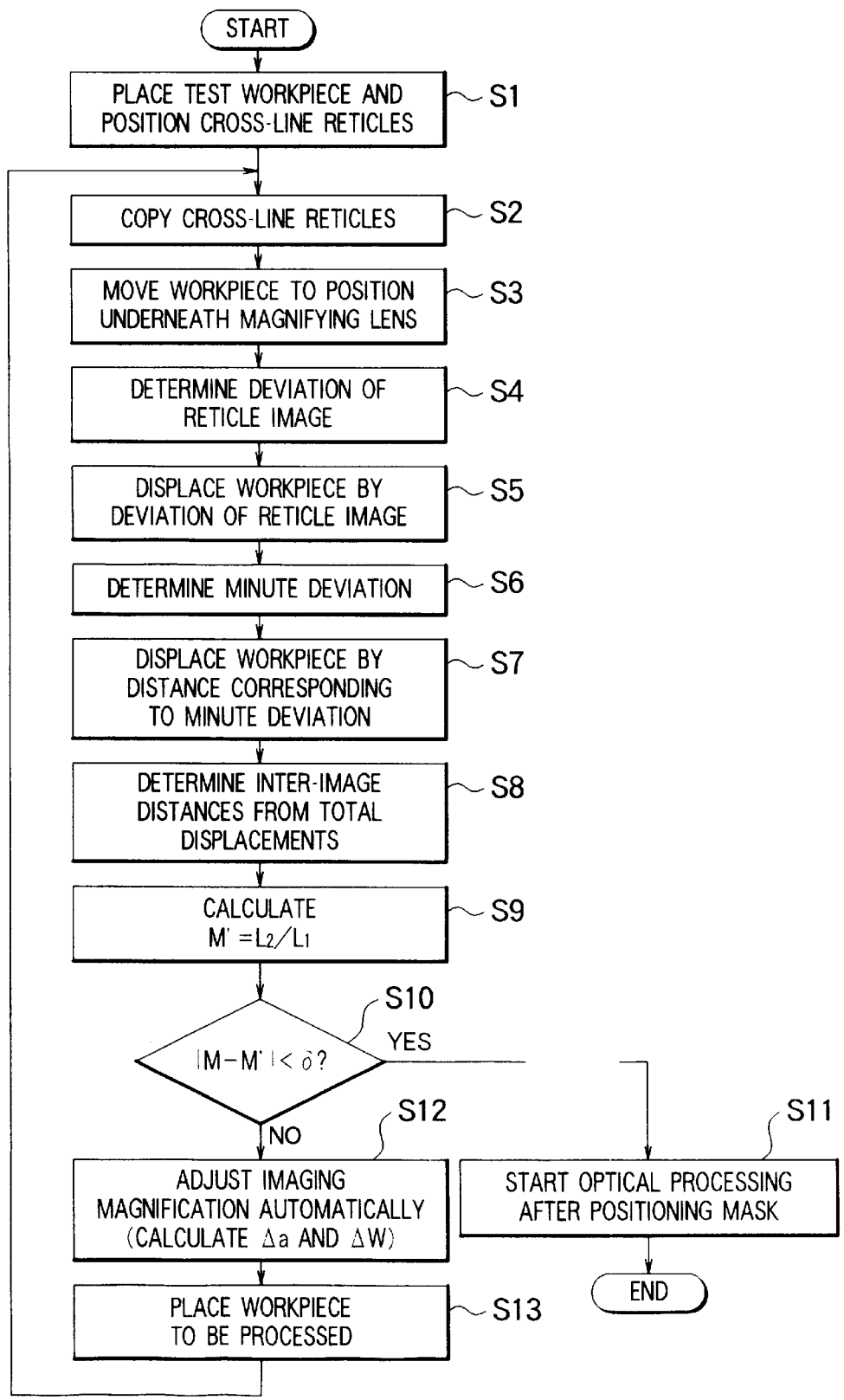
FIG. 4 is a flow chart for illustrating a magnification adjusting procedure in the optical processing apparatus shown in FIG. 1.
Figure 7:
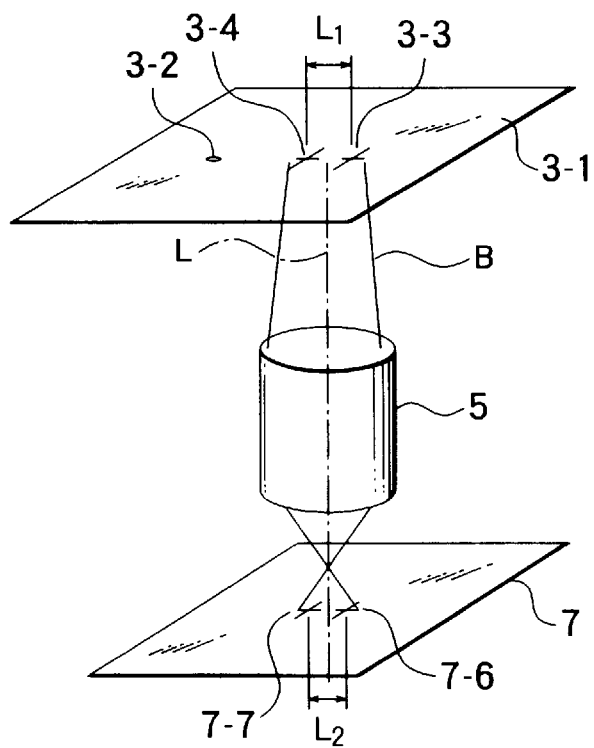
FIG. 7 is a perspective view for illustrating schematically operation or procedure for measuring an actual imaging magnification value.

In a step S1 shown in FIG. 4, a new workpiece 7 is placed on the workpiece fixing mount 74, whereupon the mask moving mechanism 4 is so controlled by the displacement control module 94 that a mid point between the cross-line reticles 3-3 and 3-4 is positioned on the optical axis L, as shown in FIG. 7.

In this state, the excimer laser oscillator 11 of the light source system 1 is driven to illuminate the test-dedicated mask 3-1 with the laser beam B to thereby form the images of the cross-line reticles 3-3 and 3-4 simultaneously on the workpiece 7 in a step S2 of FIG. 4.

Figure 8:
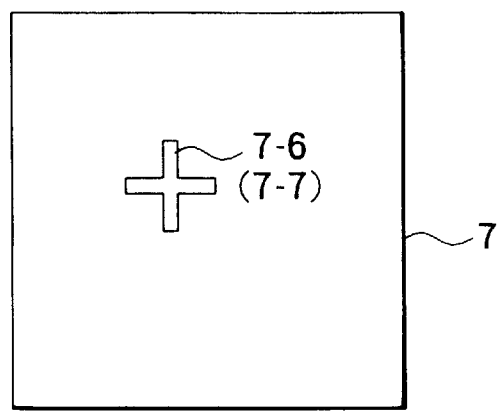
FIG. 8 is a schematic top plan view showing a workpiece in the state where a cross-line reticle is viewed through a workpiece pattern observing device.
Figure 9:
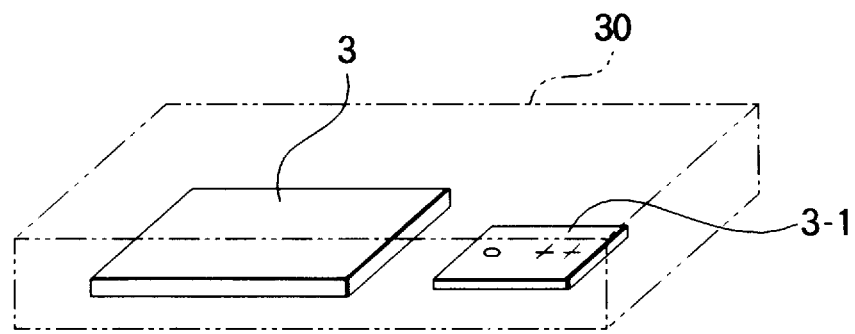
FIG. 9 is a perspective view for illustrating schematically a mask holder provided with a test mask.

Each of the reticle images 7-6 and 7-7 formed in the workpiece 7 is read through the copied pattern observing device 8, as is illustrated in FIG. 8, whereupon the distance between the reticle images 7-6 and 7-7 is arithmetically determined by the central control unit 9 on the basis of the information supplied from the image processing unit 83.

At this juncture, it should be mentioned that when the reticle image 7-6 (7-7) as formed in the workpiece 7 is observed through the two-dimensional CCD camera 82, error may be involved in the position measuring under the influence of aberrations of the magnifying lens 81 if the reticle image 7-6 is viewed at a place distanced from the optical axis of the magnifying lens 81. Accordingly, in order to measure the position of the reticle mark image 7-6 with high accuracy, it is desirable to move the workpiece 7 so that the reticle image 7-6 is positioned in the vicinity of the optical axis of the magnifying lens 81 (i.e., in the vicinity of the center of the two-dimensional CCD camera 82, to say in another way, because the center of the two-dimensional CCD camera 82 coincides with the optical axis of the magnifying lens 81) where the influence of aberrations of the magnifying lens 81 can be reduced to a minimum.

For the reason described above, there is adopted a position adjusting procedure, which will be elucidated below.

At first, the workpiece moving mechanism 6 is moved so that the reticle image 7-6 of the paired reticle images 7-6 and 7-7 can be viewed or observed, to thereby position the reticle image 7-6 underneath the magnifying lens 81 (step S3 in FIG. 4).

In this state, the reticle image 7-6 is observed through the medium of the magnifying lens 81, whereon deviation of the reticle image 7-6 from the center position of the two-dimensional CCD camera 82 is arithmetically determined by the image processing unit 83 (step S4 in FIG. 4).

Information of the deviation is transferred from the image processing unit 83 to the central control unit 9, whereby the workpiece moving mechanism 6 is controlled by the displacement control module 94 such that the workpiece 7 is displaced toward the center position of the two-dimensional CCD camera 82 by a distance corresponding to the deviation mentioned above (step S5 in FIG. 4). In that case, the displacement of the workpiece 7 is detected by the position detector mentioned hereinbefore.

In this state, there may also arise a possibility that the center of the reticle image 7-6 might be slightly deviated from the center of the two-dimensional CCD camera 82. Accordingly, the reticle image 7-6 is again observed through the two-dimensional CCD camera 82 to allow a possible positional deviation of the center of the reticle image 7-6 from that of the two-dimensional CCD camera 82 to be arithmetically determined by the image processing unit 83 (step S6 in FIG. 4).

Information of the slight deviation, if any, is supplied from the image processing unit 83 to the central control unit 9, whereupon the displacement control module 94 controls the workpiece moving mechanism 6 such that the reticle image 7-6 is displaced toward the center of the two-dimensional CCD camera 82 by a distance corresponding to the deviation detected again (step S7 in FIG. 4).

Thus, the reticle image 7-6 is brought to the position at which the center thereof substantially coincides with that of the two-dimensional CCD camera 82. In this state, the displacement of the reticle image 7-6 is determined.

The overall displacement of the reticle image 7-6 moved twice, as described above, is detected by the position detector mentioned previously. Thus, the overall displacement of the reticle image 7-6 can be determined by the central control unit 9 on the basis of the information furnished by the position detector, which in turn means that the center position of the reticle image 7-6 can be determined with high accuracy.

For the reticle image 7-7, similar positioning procedure is taken for determining accurately the center position of the reticle image 7-7.

Further, the central control unit 9 arithmetically determines an inter-image distance $L_2$ between the reticle image 7-6 and the reticle image 7-7 on the basis of a difference in the overall displacement between the reticle image 7-6 and the reticle image 7-7, the difference as determined being inputted to the actual imaging magnification arithmetic module 91 (step S8 in FIG. 4).

The actual imaging magnification arithmetic module 91 determines by calculation an actual imaging magnification value M' ($=L_2/L_1$) representative of the ratio between the inter-image distance $L_2$ as determined and the inter-reticle distance $L_1$ known previously. Information of the actual imaging magnification value M' is then outputted to the magnification decision module 92 (step S9 in FIG. 4).

The magnification decision module 92 is designed to make decision as to whether a difference between the actual imaging magnification value M' and the desired imaging magnification value M falls within a range of permissible values δ (step S10 in FIG. 4).

When the decision step S10 results in affirmation "YES", the magnification adjusting operation is-completed, whereupon the optical processing operation is activated (step S11 in FIG. 4). If otherwise (i.e., when the answer of the decision step S10 is negative "NO"), a corresponding signal is issued to the z-axis displacement control module 93 to perform the magnification adjusting operation (step S12 in FIG. 4).

In the z-axis displacement control module 93, a calculated mask-to-lens distance Δa between the mask and the imaging lens and a calculated mask-to-workpiece distance Δw between the mask and the workpiece are arithmetically determined on the basis of the desired imaging magnification value M, the actual imaging magnification value M' and the focal length f of the imaging lens in accordance with the following expressions (1) and (2):

$$\Delta a = f \times ((1/M')-(1/M)) \quad (1)$$

$$\Delta w = f \times ((M'-M+(1/M')-(1/M)) \quad (2)$$

Subsequently, the imaging lens 51 is so controlled that the actual distance between the mask 3 and the imaging lens 5 coincides with the calculated mask-to-lens distance Δa while the z-axis workpiece moving mechanism 61 is so controlled that the actual distance between the mask 3 and the workpiece 7 coincides with the calculated mask-to-workpiece distance Δw. In this way, automatic adjustment of the magnification can be realized.

After the automatic magnification adjustment, the workpiece 7 is exchanged with a new one, whereupon the procedure described above is again executed to confirm whether the automatically adjusted magnification coincides with the desired imaging magnification value M (step S13 in FIG. 4).

Concerning the automatic magnification adjustment, an experimentally numerical example will be mentioned below. A test-dedicated mask 3-1 having the inter-reticle distance $L_1$ of 10.000 mm was used. The inter-image distance $L_2$ was then 5.001 mm. The resolution of measurement of the inter-image distance $L_2$ was about 0.5 μm. Thus, the actual imaging magnification value M' was 0.5001. Accordingly, from the expressions (1) and (2), the calculated mask-to-lens distance Δa was determined to be −60 μm with the calculated mask-to-workpiece distance Δw being −45 μm. On the basis of the calculated mask-to-lens distance Δa and the calculated mask-to-workpiece distance Δw thus determined, positional adjustment for the imaging lens 5 and the workpiece 7 was carried out. Thereafter, the magnification was measured again, which showed that the actual imaging magnification value M' was corrected to the desired imaging magnification value M of 0.5000.

As pointed out hereinbefore, the material or composition of the imaging lens 5 will undergo degradation more or less with the refractive index changing correspondingly as a function of time lapse under the influence of the excimer laser beam. Nevertheless, with the optical processing apparatus according to the invention, there can be ensured high-precision copying and processing operation without any problematic error because the calculated mask-to-lens distance Δa and the calculated mask-to-workpiece distance Δw are established by the z-axis displacement control module 93 in accordance with the expressions (1) and (2) and because the actual imaging magnification value M' is so corrected as to coincide with the desired imaging magnification value M.

Upon completion of the magnification adjustment procedure described above, the intrinsic optical processing operation is started (step S11 in FIG. 4).

More specifically, a mask 3 to be used for the optical processing as intended is now mounted on the mask holder 30 in the manner described hereinbefore while a workpiece 7 (to be optically processed or machined with the laser beam) is secured onto the workpiece fixing mount 74. In order to perform the optical copying and processing (machining) with high accuracy, it is required to position precisely the mask 3 held on the mask holder 30 and the workpiece 7 on the workpiece fixing mount 74 in both the x- and y-directions.

The positioning operation may be carried out in the manner explained below.

The mask moving mechanism 4 and the workpiece moving mechanism 6 are controlled by the displacement control module 94 of the central control unit 9 to thereby move the mask 3 and the workpiece 7 toward the mask pattern observing device 20 and the copied pattern observing device 8 by predetermined distances, respectively.

positions of the alignment marks on the mask 3 and the workpiece 7 are detected through the mask pattern observing device 20 and the copied pattern observing device 8, respectively. When the positions for these alignment marks are deviated from the reference positions on the imaging planes of the mask pattern observing device 20 and the copied pattern observing device 8, the mask moving mechanism 4 and the workpiece moving mechanism 6 are so controlled that coincidence is established between the alignment marks and the reference points.

Further, for carrying out optical copying and processing (machining), the distance between the mask 3 and the workpiece 7 positioned in the x- and y-directions as mentioned above has to be set at the distance in the z-direction (i.e., along the optical axis L) which has been determined through the magnification adjusting procedure described previously.

The positioning in the z-direction may be carried out in the manner described below.

In this conjunction, it will be appreciated that the optical copying and processing for machining a workpiece as intended may be carried out by exchanging various masks 3. In that case, thickness of the mask may vary from one to another mask.

However, in the optical processing apparatus according to the instant embodiment of the invention, the mask 3 is mounted on the mask holder 30 in such disposition in which the patterned surface 3d faces downwardly, as shown in FIG. 2. Accordingly, even when the thickness of the light-transmissive substrate 3a differs from one to another mask, the patterned surface 3d is always positioned at a predetermined position by the lower holding member 31. Thus, notwithstanding of exchange of the masks 3, the distance between the mask 3 as placed on the holder 30 and the imaging lens 5 is held at the calculated mask-to-lens distance Δa established through the automatic adjusting procedure described hereinbefore.

Upon completion of the optical copying operation for a workpiece 7, the latter must be exchanged with a new one. In that case, the thickness of the workpiece 7 undergone the processing often changes from that of a fresh workpiece to replace.

particularly in the case where the workpiece 7 is a multi-layer printed substrate, the thickness of the substrate increases about 50÷m every time a new layer is stacked. On the other hand, after adjustment of the magnification of the imaging lens 5, it is necessary to maintain constant the distance between the top surface (i.e., surface to be processed) of the workpiece 7 and the imaging lens 5. Under the circumstances, the height up to the top surface of the workpiece 7 to be processed is measured by the workpiece height measuring device 10 which may be constituted by a laser based distance or length measuring device, and the measured height value is stored in the central control unit 9 to be used subsequently as a reference value for the height of concern.

Upon exchange of the workpiece 7 undergone the processing with a new one, the distance to the virgin workpiece 7 as mounted is measured, whereupon the position of the z-axis workpiece moving mechanism 61 is controlled by the z-axis displacement control module 93 so that the newly measured height becomes equal to the reference height value. In this way, the distance between the mask 3 and the workpiece 7 can be held at the calculated mask-to-workpiece distance Δw set through the magnification adjusting procedure described previously regardless of exchange of the workpiece 7 with a fresh one.

The optical copying operation for the workpiece 7 by using the mask 3 both positioned in the x-, y- and z-directions as described above are carried out by taking synchronism between the mask 3 and the workpiece 7 in displacement thereof.

More specifically, the mask 3 having a large-area pattern surface 3d is at first mounted on the mask holder 30. Thereafter, by controlling the synchronous mask moving mechanism 42 and the synchronous workpiece moving mechanism 62 by means of the displacement control module 94 incorporated in the central control unit 9, the mask 3 and the workpiece 7 are scanned in synchronism with each other with the laser beam in opposite directions, respectively, at a speed ratio corresponding to the desired imaging magnification value M mentioned previously to thereby transfer the large-area pattern image of the mask 3 to the workpiece 7.

As will now be appreciated from the foregoing description, with the optical processing apparatus according to the instant embodiment of the invention, the magnification for copying or transferring the mask pattern to the workpiece can be adjusted to the desired imaging magnification value M by using the test-dedicated mask 3-1. Besides, once the imaging magnification has been adjusted, the mask 3 and the workpiece 7 can automatically be so positioned that the desired imaging magnification value M mentioned above is maintained.

Thus, the optical processing apparatus according to the instant embodiment of the invention can be applied advantageously and profitably to the optical processing of a so-called green sheet before firing polyimide and ceramics used as inter-layer insulation materials for a multi-layer printed substrate. In the optical copying processing of the of the green sheet, realization of inter-hole dimensions with high accuracy is imperative. Besides, the exchange of the green sheets are required with high frequency. In that case, the thickness of the green sheet will vary upon every exchange. Consequently, inter-layer pattern alignment has to be performed every time the green sheets are exchanged. In this conjunction, by applying the optical processing apparatus according to the instant embodiment of the invention to the processing of the green sheets, the alignment can automatically be realized while enjoying a high throughput.

The optical processing apparatus described above is susceptible to numerous modifications or versions, which will briefly be descried below.

It has been described that a pair of cross-line reticles 3-3 and 3-4 are used in association with the test-dedicated mask 3-1. It should however be noted that three or more cross-line reticles may be used as the test pattern. In that case, the measurement accuracy can further be improved because of an increased amount of data available for the measurement.

Besides, the cross-line reticles 3-3 and 3-4 may be replaced by a rectangular test pattern having a size of 10 mm×10 mm. In that case, by measuring the lengths of sides of the rectangular pattern by means of the copied pattern observing device 8 and the image processing unit 83, it is equally possible to arithmetically determine the actual imaging magnification value M' similarly to the case where the cross-line reticles 3-3 and 3-4 are employed. Namely, the x-axial positions of the sides of the rectangular test pattern which extend in parallel with the y-axis are measured, whereupon the actual imaging magnification value M' is calculated on the basis of the positional difference between the two sides in the x-direction. Of course, it is self-explanatory to use other patterns than the rectangle, to the substantially same effect.

Additionally, the through-hole 3-2 of the test-dedicated mask 3-1 may be used for determination of the magnification for the optical copying processing instead of the determination of the focal point described hereinbefore. In that case, the optical copying processing is carried out by driving the synchronous mask moving mechanism 42 and the synchronous workpiece moving mechanism 62 for scanning synchronously the mask 3 and the workpiece 7 with the laser beam. By way of example, assuming that the desired imaging magnification value M to be set by the imaging lens 5 is 0.5, the workpiece 7 is moved by the synchronous workpiece moving mechanism 62 at a speed of ½ v in the x-direction while the mask 3 is moved at a speed v in the opposite x-direction by the synchronous mask moving mechanism 42 by controlling the synchronous workpiece moving mechanism 62 and the synchronous mask moving mechanism 42 by means of the central control unit 9. Thereafter, the length of an elongated slot formed in the workpiece 7 through the synchronous optical copying processing mentioned above and extending in the scanning direction (i.e., in the x-direction) is measured.

Figures 12, 13:
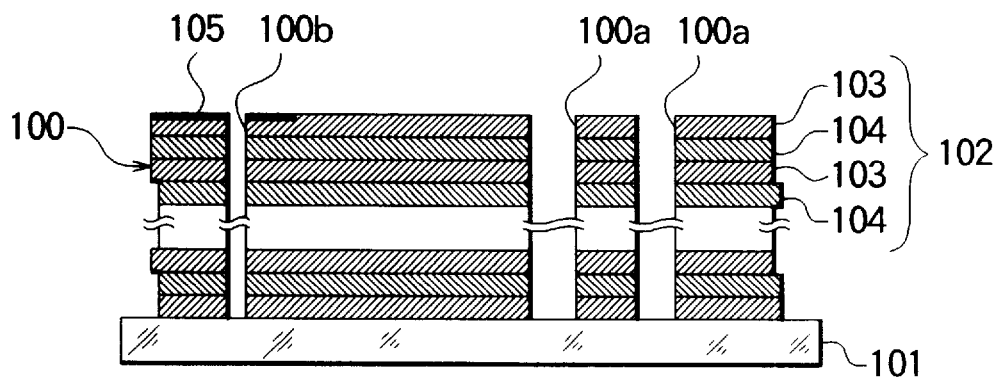
FIG. 12 is a view showing molecular structures of workpieces to be optically processed with the apparatus according to the present invention.
FIG. 13 is a sectional view showing a structure of a mask which can be employed in the optical processing apparatus according to the invention.
Figure 22:
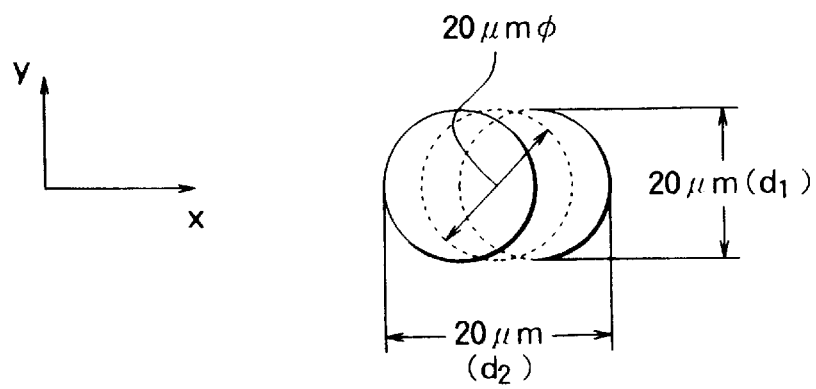
FIG. 22 is a diagram for illustrating deformation or deviations of a hole to be formed with the optical processing apparatus known heretofore.
Figure 23:
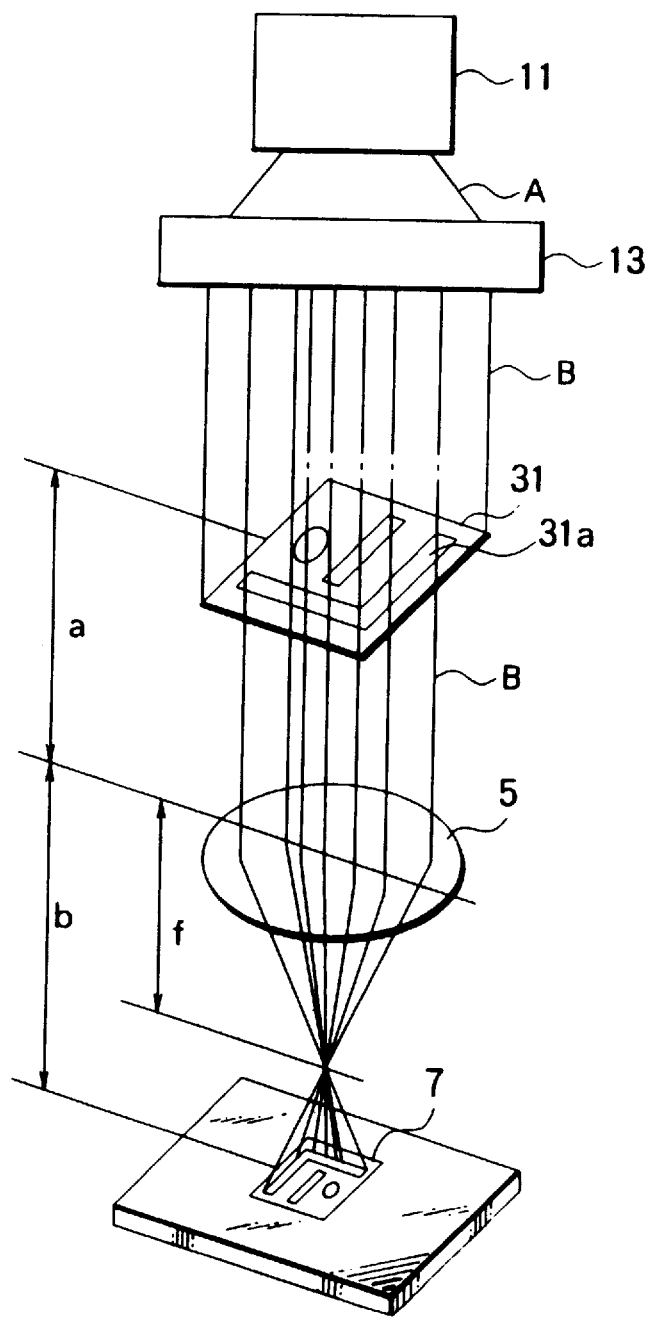
FIG. 23 shows another example of optical processing apparatus known heretofore.

In that case, when the short diameter of the elongated slot is represented by d1 with the long diameter being represented by d2, as is illustrated in FIG. 13, while the effective inlet aperture of the imaging lens 5 is represented by D (see FIG. 22), the actual imaging magnification arithmetic module 91 can then determine the actual imaging magnification value M' in accordance with the following expression (3):

$$M'-M=M\times M\times(d2-d1)/(D-M\times(d2-d1)) \quad (3)$$

Moreover, in the case of the optical processing apparatus described in the foregoing, the test-dedicated mask 3-1 is used for adjustment of the imaging magnification while the mask 3 is employed in the optical copying processing. However, by implementing the mask holder 30 in a structure capable of holding both the mask 3 and the test-dedicated mask 3-1, the adjustment of the imaging magnification can be effected in a fully automated manner. Furthermore, a mask 3 provided with both the through-hole 3-2 and the cross-line reticles 3-3 and 3-4 may be employed substantially to the same effect.

In the optical processing apparatus according to the first embodiment of the invention, the mask 3 is mounted on the mask holder 30 with the patterned surface 3d thereof facing downwardly in opposition to the high reflectivity mirror 2. In this conjunction, it is noted that when the ultraviolet light source such the excimer laser is employed, loss of energy of the laser beam B due to absorption in the course of reciprocative reflections between the mask 3 and the high reflectivity mirror 2 will become more negligible. This problem can however be solved by mounting the mask 3 with the patterned surface 3d facing upwardly (i.e., toward the high reflectivity mirror 2). In that case, it is preferred to use the mask 3 having the light-transmissive substrate 3a of a substantially constat thickness so that the distance between the light-transmissive substrate 3a and the imaging lens 5 can be maintained to be constant. By way of example, in the case where the imaging magnification is 0.5, dispersion or deviation can be suppressed to within a range of ±0.001 by using the mask 3 having the thickness tolerance of ±30 μm.

Embodiment 2

The optical processing apparatus according to a second embodiment of the invention differs from the first embodiment in that a contact-type length measuring device (not shown) is employed as the workpiece height measuring device 10. More specifically, a contact-type length measuring device is used as the workpiece height measuring device 10 for measuring the height of the workpiece 7 in the direction parallel to the optical axis L, wherein the z-axis displacement control module 93 incorporated in the central control unit 9 is designed to control the z-axis (optical axis) workpiece moving mechanism 61. In this conjunction, it should be mentioned that when the laser-type length measuring device is employed as in the case of the optical processing apparatus according to the first embodiment of the invention, measurement can not evade more or less error when the workpiece 7 is transparent. However, such an error can substantially be avoided by using the contact-type length measuring device even when the workpiece 7 is light-transmissive, whereby high accuracy can be ensured for the optical copying processing. With regards to the other respects, the optical processing apparatus according to the second embodiment of the invention is similar to the first embodiment. Accordingly, repeated description is omitted.

Embodiment 3

The optical processing apparatus according to a third embodiment of the invention differs from the second embodiment in the respect that the magnifying lens 81 and the two-dimensional CCD camera 82 constituting the copied pattern observing device 8 also serves for the function of the workpiece height measuring device 10.

More specifically, in the optical processing apparatus according to the instant embodiment of the invention, a lens having a shallow depth of focus is employed as the magnifying lens 81 for magnifying the image projected onto the workpiece 7, which image is picked up by the two-dimensional CCD camera 82 to be supplied to the image processing unit 83, wherein the image processing unit 83 determines whether or not the image as picked up is in focus. When it is determined that the image picked up is out of focus, the z-axis workpiece moving mechanism 61 is controlled by the z-axis displacement control module 93 of the central control unit 9 so that the workpiece 7 is disposed at the in-focus position. In this conjunction, it should however be mentioned that the substantially same effect can be obtained even when other photoelectric detecting device than the two-dimensional CCD camera is employed. With regards to the other respects, the optical processing apparatus according to the instant embodiment of the invention are essentially same as the first and second embodiments of the invention. Accordingly, repeated description will be unnecessary.

Embodiment 4

Figure 10:
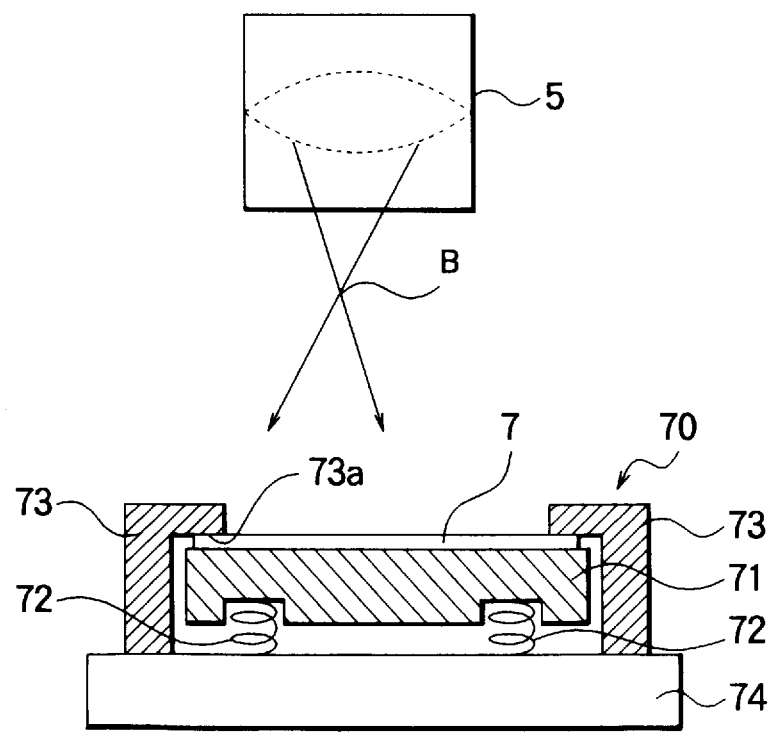
FIG. 10 is a cross-sectional view showing a structure of a workpiece holder.

The optical processing apparatus according to a fourth embodiment of the invention differs from the apparatus according to the first to third embodiments in that a workpiece holding assembly is employed in place of the workpiece height measuring device 10. Referring to the FIG. 10, the workpiece holder assembly 70 is mounted on a stationary base plate 74. As can be seen in the figure, the workpiece holder assembly 70 is comprised of a workpiece mount 71 on which the workpiece 7 is disposed, a plurality of springs 72 serving for urging resiliently the workpiece mount 71 in the direction toward the workpiece height measuring device 10 in the state in which the workpiece mount 71 is floating from the stationary base plate 74, and a retaining frame 73 secured fixedly onto the stationary base plate 74.

With the structure of the workpiece holder assembly 70 described above, the workpiece 7 disposed on the workpiece mount 71 is urged toward the workpiece height measuring device 10 under the resiliency of the springs 72, whereby the surface of the workpiece 7 to be processed is caused to abut against the stopper surface 73a of the retaining frame 73.

Thus, even when the workpieces 7 have different thicknesses, the surfaces thereof to be processed are always positioned at a predetermined position defined by the stopper surface 73a, whereby the distances between the workpieces 7 and the imaging lens 5 are prevented against changing even when the thickness of the workpiece 7 changes from one to another workpiece. As a result of this, the distance between the mask 3 and the workpiece 7 is held at the calculated mask-to-workpiece distance Δw established through the automatic adjusting procedure described hereinbefore in conjunction with the first embodiment of the invention, notwithstanding of any possible variation in the thickness of the workpieces 7 which are exchanged upon completion of the optical processing operation.

parenthetically, the instant embodiment of the invention is also susceptible to modifications. By way of example, the compression springs 72 may be replaced by rubber or the like resilient members. Additionally, such an arrangement may equally be adopted in which the workpiece mount 71 is pushed in the direction toward the imaging lens 5 by means of screws.

With regards to the other respects, the optical processing apparatus according to the instant embodiment of the invention is essentially identical with the first to third embodiments. Accordingly, any further description of the fourth embodiment will be unnecessary.

Embodiment 5

The optical processing apparatus according to a fifth embodiment of the invention differs from the first to fourth embodiments in that a z-axis (optical axis) mask moving mechanism (not shown) is provided for moving or displacing the mask 3 in the direction parallel to the optical axis L.

The z-axis mask moving mechanism of concern may be mounted on the synchronous mask moving mechanism 42, wherein the mask holder 30 is secured onto the z-axis mask moving mechanism.

The mask 3 can thus be moved in the direction parallel to the optical axis L by means of the above-mentioned z-axis mask moving mechanism under the control of the z-axis displacement control module 93 incorporated in the central control unit 9.

Accordingly, in the case of the optical processing apparatus according to the instant embodiment of the invention, the imaging magnification changing mechanism can be implemented in the form of a combination of the z-axis mask moving mechanism and the z-axis workpiece moving mechanism 61 or a combination of the z-axis mask moving mechanism and the z-axis (optical axis) lens moving mechanism 51.

With the structure described above, the desired imaging magnification value M can be maintained in the focusing operation, the automatic magnification adjusting operation and the workpiece height measuring operation as well as upon exchanging of the workpieces.

With regards to the other respects, the optical processing apparatus according to the fifth embodiment of the invention is essentially similar to the first to fourth embodiments. Accordingly, further description is omitted.

Embodiment 6

In the optical processing apparatus according to a sixth embodiment of the invention, a synchronous lens moving mechanism (illustration of which is omitted) is additionally provided for allowing the imaging lens 5 to be moved in the direction orthogonally to the optical axis L. In this respect, the instant embodiment differs from the first to fifth embodiments described above.

The synchronous lens moving mechanism of concern is mounted intermediate between the z-axis lens moving mechanism 51 and the imaging lens 5. By controlling this synchronous lens moving mechanism by a displacement control module 94 of the central control unit 9, the imaging lens 5 can be displaced in the direction extending orthogonally to the optical axis L.

Upon illumination of the mask 3 with the laser beam B, either the above-mentioned synchronous lens moving mechanism and the synchronous mask moving mechanism 42 or alternatively the former and the synchronous workpiece moving mechanism 62 are moved synchronously in the opposite directions, respectively, at a speed ratio corresponding to the desired imaging magnification value M under the control of the displacement control module 94.

In the other respects, the optical processing apparatus according to the sixth embodiment of the invention is essentially similar to the first to fifth embodiments. Accordingly, any further description in these respects will be unnecessary.

Embodiment 7

In the optical processing apparatus according to a seventh embodiment of the invention, the mask moving mechanism 4 is so arranged as to serve for the function of the synchronous mask moving mechanism 42 with the workpiece moving mechanism 6 serving for the function of the synchronous workpiece moving mechanism 62.

With the arrangement described above, the structure of the optical processing apparatus as a whole can be implemented inexpensively in a simplified structure.

In the other respects, the optical processing apparatus according to the instant embodiment is substantially same as the first to sixth embodiments. Accordingly, repetition of the description will be unnecessary.

Embodiment 8

Figure 11:
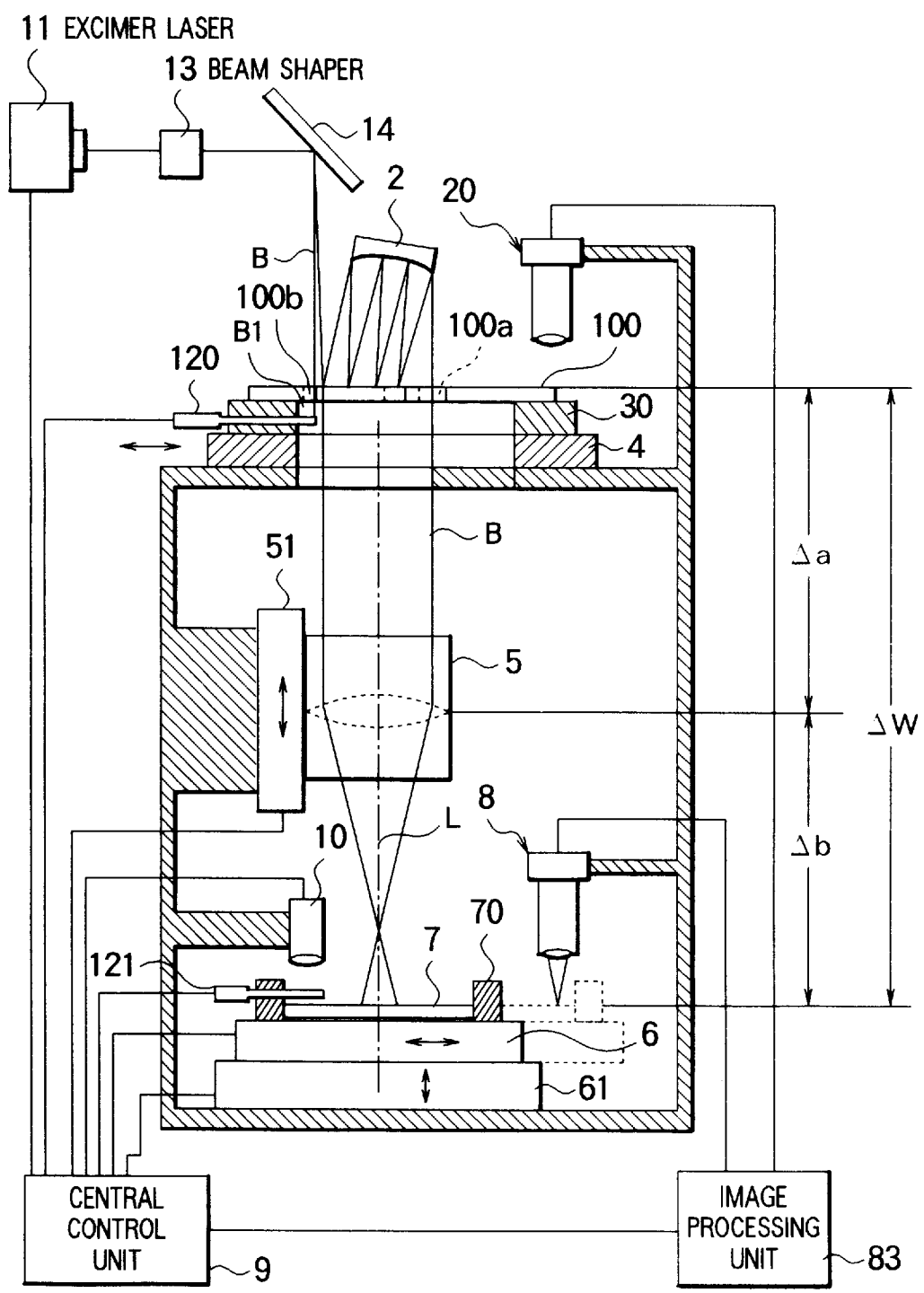
FIG. 11 is a schematic diagram showing a general arrangement of an optical processing apparatus according to another embodiment of the present invention.

FIG. 11 is a diagram showing a structure of the optical processing apparatus according to an eighth embodiment of the present invention. In the figure, same or like components as those of the optical processing apparatus shown in FIG. 1 are denoted by same reference characters. Further, it should be added that the synchronous mask moving mechanism 42, the synchronous workpiece moving mechanism 62 and others are omitted from illustration in FIG. 11 for the purpose of clarification of major portions of the apparatus according to the instant embodiment.

At the beginning, it should be pointed out that the optical processing apparatus according to the instant embodiment of the invention is so implemented as to be applied to a mass production in which the function of the mask is required to be sustained over an elongated period. In this respect, the optical processing apparatus now under consideration differs from those described hereinbefore in conjunction with the first to seventh embodiments.

Now, referring to FIG. 11, the optical processing apparatus is comprised of the excimer laser oscillator 11, the beam shaping optical system 13, the incident angle adjusting mirror 14 and the high reflectivity mirror 2, wherein the laser beam B emitted from the excimer laser oscillator 11 and transmitted through a light-transmitting portion 100a of a mask 100 forms a diminished pattern of the mask 100 on a workpiece 7 under the optical action of the imaging lens 5. Thus, the mask image portion on the surface of the workpiece 7 to be processed is subjected to pulse-like illumination shots each of a duration on the order of nanoseconds, whereby the material of the workpiece 7 is removed from the top layer to the bottom one in the image region under the effect of what is called the ablasion phenomenon, as a result of the mask 100 is formed on the workpiece 7.

By disposing the high reflectivity mirror 2 above the mask 100 in opposition thereto, the laser beam B is reflected repetitively between the high reflectivity mirror 2 and the mask 100 (i.e., multi-reflection of the laser beam B). Thus, the utilization efficiency of the expensive excimer laser can be enhanced, to an advantage from the economical view point as well.

The excimer laser oscillator 11 of the optical processing apparatus now under consideration is constituted by a KrF-laser (krypton fluorine laser) device, because it is intended with the invention incarnated in the instant embodiment that the optical processing apparatus is used for performing the ablasion processing on a workpiece made of a high-molecular material (polymer) such as polyimide (PI), polyethylene terephthalate (PET), polyethylene (PE), polyurethane (PUR), polyvinyl chloride (PVC) or the like or a workpiece or green sheet made of a material of alumina series or zirconia series.

More specifically, in order to perform the ablasion processing for forming holes, grooves, marks and/or the like, the molecular structure or chain of the raw material of the workpiece must be disconnected with the laser beam. By way of example, the molecular structure of the polyimide (PI) film has C—C bonds and C—H bonds, as can be seen in FIG. 12. Accordingly, for realizing the ablasion processing, it is required to use the laser beam of energy level capable of breaking the bonds mentioned above. In this conjunction, C—C bond energy is at 3.5 eV while C—H bond energy is at 4.3 eV. Accordingly, for effectuating the optical processing on the workpiece of polyimide (PI) film, it is required to use either KrF-laser beam (of 5 eV) or ArF (argon fluorine) laser beam which can afford higher energy level than the bond energy mentioned above.

However, the ArF-laser beam undergoes high absorption in transmitting through the air and the optical elements although it depends on the material thereof. Accordingly, the use of the ArF-laser beam is limited to within an evacuated space, which in turn means that the optical processing with the ArF-laser beam is subjected to severe limitation, to a disadvantage. On the other hand, the KrF-laser beam is essentially immune to the problems mentioned above. In reality, the KrF-laser beam undergoes little absorption in the air. For these reasons, in the optical processing apparatus according to the instant embodiment of the invention, a KrF-laser beam B of 248 nm in wavelength is used for performing the ablasion processing successfully.

On the other hand, because of illumination with the KrF-laser beam of such high energy as mentioned, the mask 100 has to be implemented in a structure which is capable of withstanding a number of the laser illuminations which is on the order of 106 to 107 shots. The mask structure suited to this end will be described below in detail.

Figures 14, 15:
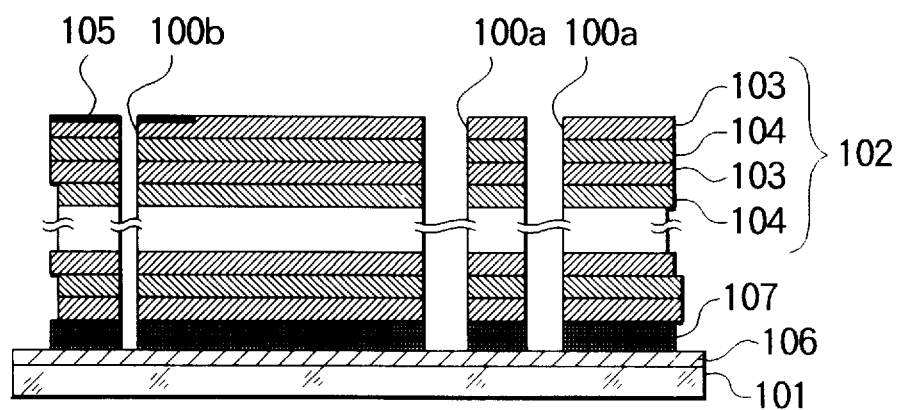
FIG. 14 shows in a table refractive indexes of various dielectrics.
FIG. 15 is a cross-sectional view showing a modification of the mask structure.

FIG. 13 is a sectional view showing a structure of the mask 100, and FIG. 14 shows a table which contains refractive indexes of dielectric materials employed for fabricating the mask.

As shown in FIG. 13, the mask 100 is comprised of a light-transmissive substrate 101 and a dielectric thin film generally denoted by a numeral 102.

The light-transmissive substrate 101 is formed of synthetic quartz glass, fluorite (e.g. calcium fluoride) or the like so that the KrF-laser beam B transmitted through the dielectric thin film 102 scarcely undergoes transmission loss and that transmittance of the light-transmissive substrate 101 is protected against degradation or variation notwithstanding of illumination with the KrF-laser beam over an extended period.

On the other hand, the dielectric thin film 102 is formed of dielectric layers 103 of high refractive index and dielectric layers 104 of low refractive index stacked alternately with one another. Extending through the dielectric layers 103 of high refractive index and the dielectric layers 104 of low refractive index, there are formed light transmitting portions 100a in a predetermined pattern.

By the way, in order to realize the multiple reflection of the laser beam between the high reflectivity mirror 2 shown in FIG. 11 and the mask 100, it is necessary that the high reflectivity mirror 2 and the dielectric thin film 102 of the mask 100 have the reflectivity not less than 99%.

For the reasons mentioned above, the dielectric layer 103 of high refractive index is formed of one of hafnium oxide ($HfO_2$), scandium oxide ($Sc_2O_3$) and aluminum oxide, while the dielectric layer 104 of low refractive index is made of either one of silicon oxide ($SiO_2$) or magnesium fluoride ($MgF_2$). By forming the dielectric thin film 102 by stacking the dielectric layers 103 of high refractive index and the dielectric layers 104 of low refractive index in a number of alternately laminated layers, which number is in a range of 20 to 30, there can be realized the mask 100 exhibiting the reflectivity of 99% or higher and the capability of withstanding the laser power of 1 J/cm$^2$ or more of the KrF-laser beam 13.

On the other hand, in order to obtain the dielectric thin film 102 having high laser power withstanding capability, it is required that the dielectric layers 103 of high refractive index and the dielectric layers 104 of low refractive index be formed as uniform as possible and that the number thereof be decreased to a possible minimum for preventing internal stresses from occurring in the dielectric thin film 102 while suppressing absorption of the KrF-laser beam energy to a possible minimum. For forming the dielectric thin film 102 which meets the conditions mentioned above, the raw materials for the dielectric layers 103 of high refractive index and the dielectric layers 104 of low refractive index should be selected such that difference in the refractive index between the dielectric layers 103 and 104 becomes large.

The dielectric layers 103 and 104 have respective refractive indexes n listed up in the table of FIG. 14.

Thus, by selecting the materials for the dielectric layer 103 of high refractive index and the dielectric layer 104 of low refractive index from the table shown in FIG. 14 such that the difference in the refractive index therebetween is large, for thereby forming the dielectric thin film 102, there can be obtained the mask 100 which can exhibit high reflectivity and high laser power withstanding capability.

In the case of the instant embodiment, hafnium oxide ($HfO_2$) having a maximum refractive index n was selected for forming the dielectric layer 103 of high refractive index, while silicon oxide ($SiO_2$) having a high purity which is easily commercially available was used for forming the dielectric layer 104 of low refractive index, whereby there could be realized the mask 100 having the reflectivity of 99% or more and the laser power withstanding capability not lower than 1 J/cm$^2$.

Again referring to FIG. 13, a test surface region 105 is formed on the top surface of the dielectric thin film 102 at the left-hand side thereof and a reference light beam transmitting portion (through-hole) 100b is formed in this region, so that the laser beam transmitted through the transmitting portion 100b can be detected as a reference laser beam B1 for the test purpose.

Parenthetically, the structure of the mask 100 is not limited to that shown in FIG. 13 but can be modified in various manners. By way of example, an anti-reflection film 106 and a metallic film 107 may be interposed between the light-transmissive substrate 101 and the dielectric thin film 102 for thereby improving the optical characteristics of the mask 100.

Next, description will turn to illumination energy density of the KrF-laser beam B with which the mask 100 is illuminated.

Figure 16:
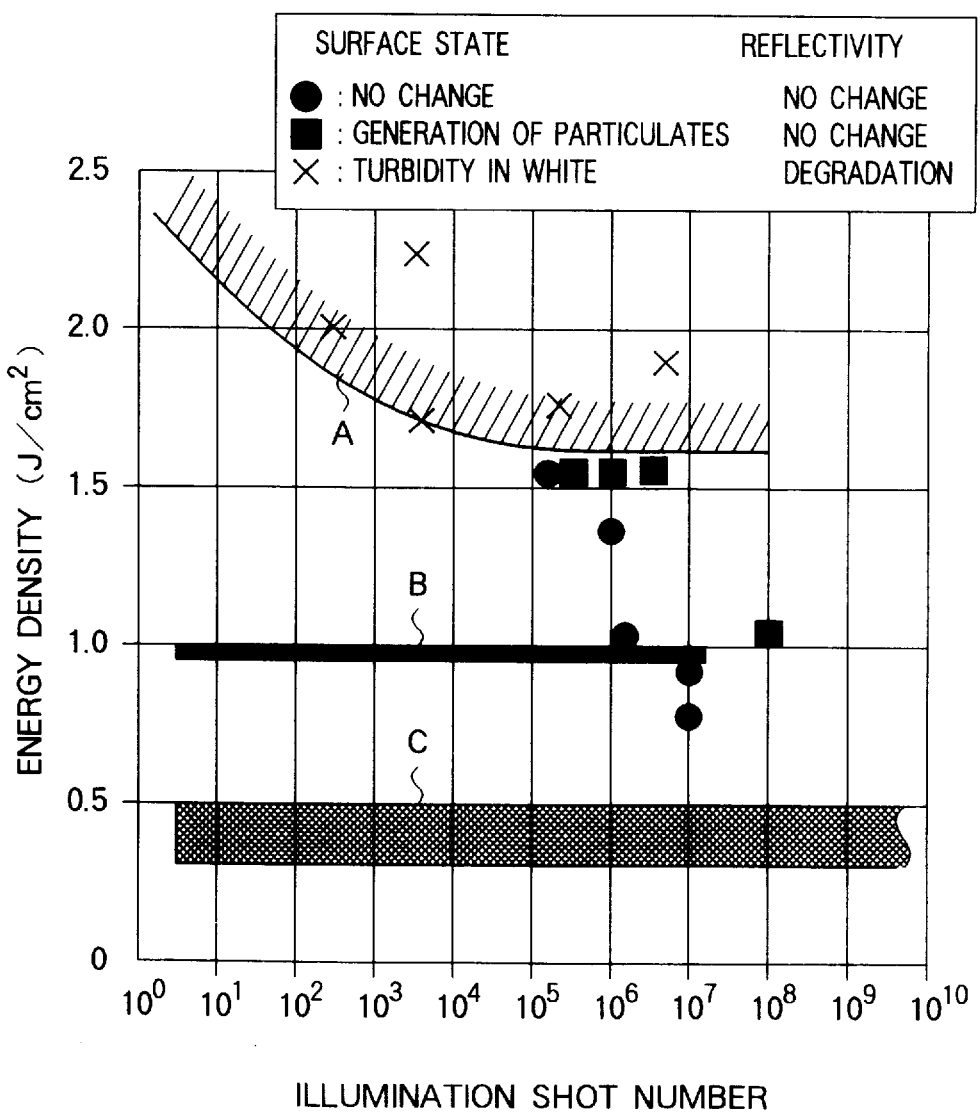
FIG. 16 is a characteristic diagram for illustrating changes or variations in the surface state or condition of a dielectric thin film of the mask.

FIG. 16 is a characteristic diagram for illustrating changes or variations in the surface state or condition of the dielectric thin film 102 of the mask 100. In the figure, illumination energy density on the dielectric thin film 102 is taken along the ordinate with the number of shots of illumination with the KrF-laser beam B being taken along the abscissa.

As can be seen from FIG. 16, when the dielectric thin film 102 is illuminated with $1 \times 10^7$ shots of the KrF-laser beam B of the illumination energy density of 0.8 J/cm$_2$, there can be observed no change in the surface condition of the dielectric thin film 102. On the other hand, illumination of the dielectric thin film 102 with $1 \times 10^8$ shots of the KrF-laser beam B with the illumination energy density of 1 J/cm$^2$ brings about formation of particulates of a diameter not greater than 1 μm on the surface of the dielectric thin film 102. However, no change can be observed in the reflectivity of the dielectric thin film 102. Furthermore, illumination with $2 \times 10^6$ shots of the KrF-laser beam B with the illumination energy density of 1.15 J/cm$^2$ brings about no change in the surface condition of the dielectric thin film 102. The same holds true in the case of illumination with $1 \times 10^6$ shots of the KrF-laser beam B of the energy density of 1.3 J/cm$^2$.

As can be understood from the above analyses, the laser-power withstanding capability of the dielectric thin film 102 depends on the illumination energy density. In this conjunction, it will further be noted that in the range of the illumination energy density of 1.5 to 1.6 J/cm$^2$ close to and higher than an injury threshold (a region A shown in FIG. 16), the laser-power withstanding capability of the dielectric thin film 102 falls steeply, as a result of which turbidity in white makes appearance on the surface of the dielectric thin film 102.

Thus, it can be concluded that by using the KrF-laser beam B with the illumination energy density which is about ½ of the laser-power withstanding capability (see region B in FIG. 16), the number of the shots of illumination can be increased by a factor of 1 to 2. Accordingly, the use life of the mask 100 can certainly be extended greater than $1 \times 10^9$ in terms of the number of shots by setting the maximum value of the illumination energy density for the dielectric thin film 102 to a value not greater than 500 mJ/cm$^2$.

However, in case the illumination energy density is set at a small value as mentioned above, the production efficiency will be degraded unless a large size of the mask 100 is employed, even though the use life of the mask can be extended. Thus, in consideration of the production efficiency as well as imaging magnification setting conditions which will be described hereinafter, the illumination energy density of the KrF-laser beam B is so set as to fall within a range of 300 to 500 mJ/cm$^2$ in the case of the instant embodiment of the invention (see a region C in FIG. 16).

Next, discussion will be made concerning a relation between an optimal working energy density and the imaging magnification on the assumption that the workpiece 7 undergoes ablasion processing by using the KrF-laser beam B.

Figure 17:
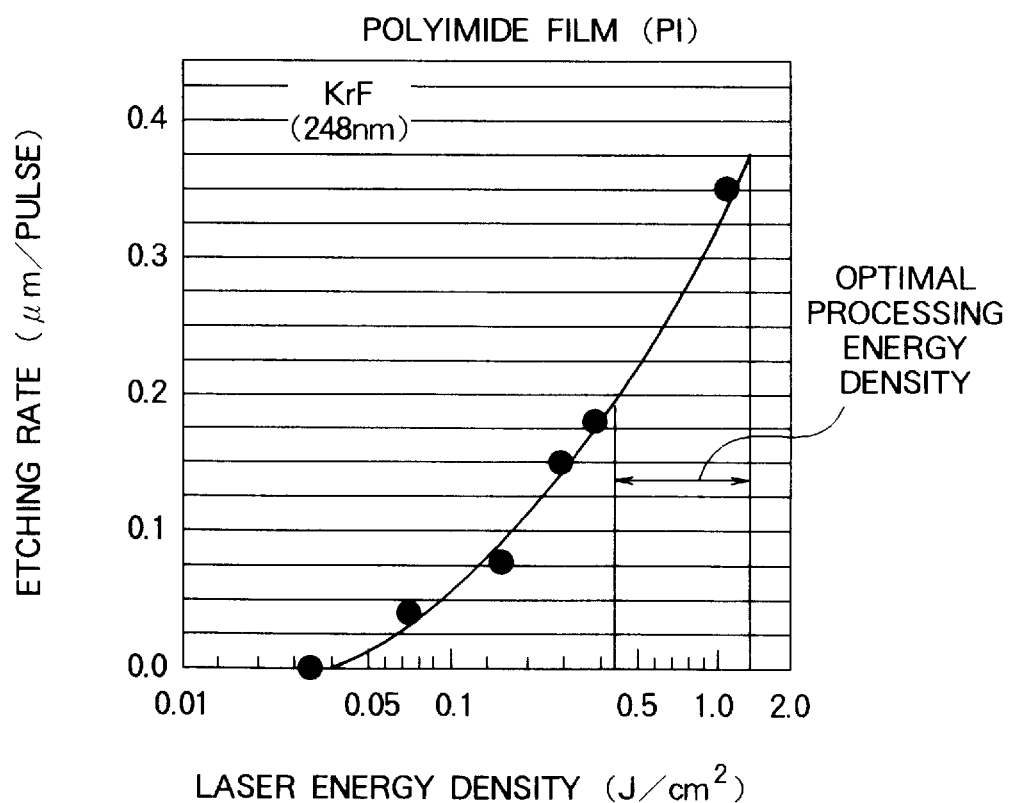
FIG. 17 is a view for graphically illustrating a relation between illumination energy density of a KrF-laser beam and an etching rate.

FIG. 17 is a view for graphically illustrating a relation between the illumination energy density of the KrF-laser beam B and an etching rate in the case where the workpiece 7 to be processed is formed of polyimide film (PI). As can be seen from this figure, the optimal illumination energy density for optically processing the workpiece 7 of the aforementioned material is 0.4 to 1.2 J/cm$^2$. With the illumination energy density lower than this range, the etching rate becomes lowered, involving degradation in the productivity. Reversely, with the illumination energy density exceeding the range mentioned above, dimensions as well as geometries of the pattern as formed will undergo deterioration under thermal effect of the KrF-laser beam B.

In general, a relation among the illumination energy density Rm of the laser beam, working energy density (i.e., laser energy density working on the surface of the workpiece 7) Rw and the magnification of the imaging lens 5 is given by the following expression (4):

$$Rw/Rm = 1/M^2 \qquad (4)$$

From the above expression (4), it can be understood that the imaging lens 5 is required to have a imaging magnification M in a range of 1/0.9 to 1/2.0 in order to illuminate the mask 100 with the KrF-laser beam B having the illumination energy density Rm of 300 to 500 mJ/cm$^2$ to thereby process the surface of the workpiece 7 with the KrF-laser beam B of an optimal working energy density in a range of 0.4 to 1.2 J/cm$^2$. In other words, the imaging magnification of the imaging lens 5 as required is 1/0.9 to 2.0. This magnification will hereinafter be referred to as the demanded imaging magnification.

However, in order to realize the ablasion processing stably over an extended period without deteriorating the mask 100, it is necessary to illuminate the mask 100 with the KrF-laser beam B of smaller illumination energy density Rm. In this conjunction, the imaging magnification M should preferably be set in a range of 1/1.3 to ½ in order to realize an optimal working energy density of 0.4 to 1.2 J/cm$^2$ with the illumination energy density Rm of 300 mJ/cm$^2$ at minimum. The above-mentioned imaging magnification will hereinafter be referred to as recommendable imaging magnification.

Thus, when the workpiece 7 is formed of a polyimide film (PI), the optimal working energy density lies within a range of 0.4 to 1.2 J/cm$^2$, wherein the demanded imaging magnification ranges from 1/0.9 to 1/2.0 with the recommendable imaging magnification ranging from 1/1.3 to 1/2.0.

Through the similar procedure, relations between the optimal working energy density, the demanded imaging magnification and the recommendable imaging magnification have been determined for the workpieces 7 formed of green sheets of polyethylene terephthalate (PET), polyethylene (PE), polyurethane (PUR), polyvinyl chloride (PVC), alumina series and zirconia series, respectively. The results are summarized in a table shown in FIG. 18. As can be seen from the figure, by using the recommendable imaging magnifications listed in the table, there can be made available the optimal working energy densities which are adequate for performing the ablasion processing on the workpieces of various materials mentioned above, even when the mask 100 is illuminated with the KrF-laser beam B of as low illumination energy density as 300 mJ/cm$^2$. Thus, the use life of the mask 100 can be extended remarkably.

In order to realize practically the demanded imaging magnification and the recommendable imaging magnification mentioned above, it is required to make it possible to change the imaging magnification of the optical system constituted by the mask 100, the imaging lens 5 and the workpiece 7. Thus, the optical processing apparatus according to the instant embodiment of the invention is equipped with the copied pattern observing device 8, the image processing unit 83, the z-axis lens moving mechanism 51, the z-axis workpiece moving mechanism 61 and the central control unit 9, wherein the z-axis lens moving mechanism 51 and the z-axis workpiece moving mechanism 61 are adapted to be controlled by the central control unit 9 on the basis of the image or video information available from the image processing unit 83, as described hereinbefore in conjunction with the first embodiment.

More specifically, a pattern formed on a workpiece 7 through the optical copying operation is viewed through the copied pattern observing device 8. Information available from the image processing unit 83 is inputted to the actual imaging magnification arithmetic module 91 of the central control unit 9. Thus, the actual imaging magnification arithmetic module 91 then calculates the actual imaging magnification M'. The result of the calculation is inputted to the central control unit 92 which then decides whether or not difference between the actual imaging magnification M' and the demanded imaging magnification M (or recommendable imaging magnification M) as the desired imaging magnification value lies within a range of permissible values δ. Unless the difference falls within the permissible value range δ, a signal indicating this fact is supplied to the z-axis displacement control module 93, which responds thereto by determining the calculated mask-to-lens distance Δa and the calculated mask-to-workpiece distance Δw on the basis of the demanded imaging magnification M (or recommendable imaging magnification M), the actual imaging magnification value M' and the focal length f in accordance with the expressions (1) and (2) mentioned hereinbefore in conjunction with the first embodiment. Thereafter, the central control unit 9 controls the z-axis lens moving mechanism 51 such that the actual distance between the mask 100 and the imaging lens 5 coincides with the calculated mask-to-lens distance Δa while the z-axis workpiece moving mechanism 61 is controlled by the central control unit 9 so that the actual distance between the mask 100 and the workpiece 7 coincides with the calculated mask-to-workpiece distance Δw. In this manner, automatic adjustment of the imaging magnification is carried out.

As described above, in the optical processing apparatus according to the instant embodiment of the invention, the mask 100 is illuminated with the KrF-laser beam B having the illumination energy density of 300 to 500 mJ/cm², wherein the calculated mask-to-lens distance Δa and the calculated mask-to-workpiece distance Δw are automatically adjusted so that the demanded imaging magnification (or recommendable imaging magnification) M required for realizing the optimal working energy density for the workpiece 7 of given material can be realized. However, for effectuating the ablasion processing with high accuracy, it is necessary that the illumination energy density falls actually within the range of 300 to 500 mJ/cm² and that the energy density at which the workpiece 7 formed of a given material is illuminated is actually the optimal working energy density.

By the way, when the movable distance of the z-axis lens moving mechanism 51 and the z-axis workpiece moving mechanism 61 is limited for the structural and operational reasons, the demanded imaging magnification (or recommendable imaging magnification) can be set by exchanging the imaging lens 5.

Theoretically, expressions (5) and (6) mentioned below apply valid:

$$\Delta a + \Delta b = \Delta w = f(M+1)^2/M \tag{5}$$

$$f = \Delta w \times M/(M+1)^2 \tag{6}$$

where Δa represents the distance between the mask 100 and the imaging lens 5, Δb represents a distance between the imaging lens 5 and the workpiece 7 (i.e., Δb=Δw−Δa), f represents the focal distance of the imaging lens 5 and M represents the demanded imaging magnification (or recommendable imaging magnification).

More concretely, after the demanded imaging magnification (or recommendable imaging magnification) M and the calculated mask-to-workpiece distance Δw have been determined, the focal distance f for deriving the demanded imaging magnification (or recommendable imaging magnification) M is determined in accordance with the expression (6). By selecting the imaging lens 5 having the focal lens f thus determined, it is possible to set the demanded imaging magnification (or recommendable imaging magnification) M in the optical processing apparatus. In that case, however, there often arises such situation that the actual imaging magnification M' does not coincide with the demanded imaging magnification (or recommendable imaging magnification) M. Accordingly, it is preferred to carry out the automatic fine adjustment described hereinbefore in conjunction with the first embodiment after mounting of the imaging lens 5 having the desired focal length f as mentioned above.

The optical processing apparatus according to the instant embodiment of the invention is further provided with laser intensity sensors 120 and 121 as the first and second laser intensity sensor means. The first laser intensity sensor 120 serves for detecting the intensity of a probe light beam B1 having passed through the reference light beam transmitting portion 100b of the mask 100, wherein the detection signal outputted from the first laser intensity sensor 120 is supplied to the central control unit 9. To this end, the first laser intensity sensor 120 is mounted on the mask holder 30 of the mask moving mechanism 4. On the other hand, the second laser intensity sensor 121 is destined for detecting the intensity of the KrF-laser beam B impinging on the surface of the workpiece 7 to be processed. The output signal of the second laser intensity sensor 121 is equally supplied to the central control unit 9. The second laser intensity sensor 121 is mounted on the workpiece holder assembly 70 of the workpiece moving mechanism 6.

The central control unit 9 responds to the detection signal supplied from the first laser intensity sensor 120 to thereby determine the current illumination energy density on the basis of the intensity indicated by the input signal and then decides whether or not the current illumination energy density lies within the range of 300 to 500 mJ/cm². By virtue of this arrangement, it is possible to detect the presence of abnormality in the intensity distribution by moving the first laser intensity sensor 120 in the horizontal direction while detecting simultaneously the intensity of the KrF-laser beam B over the whole surface of the mask 100 by controlling correspondingly the mask moving mechanism 4. When it is found that the intensity of the KrF-laser beam B exceeds locally the energy range of 300 to 500 mJ/cm², the output power of the excimer laser oscillator 11 is regulated for eliminating abnormality in the intensity distribution. In this way, the mask 100 can be protected against premature degradation.

Similarly, the current working energy density is determined on the basis of the intensity indicated by the signal supplied from the second laser intensity sensor 121, whereon decision is made as to whether the energy density as determined lies within the optimal working energy density range. By moving the second laser intensity sensor 121 in the horizontal direction by controlling the workpiece moving mechanism 6, it is possible to detect possible presence of abnormality in the intensity distribution of the KrF-laser beam B over the whole surface of the workpiece 7 to be processed. When the KrF-laser beam B locally exceeds the optimal working energy density range, the output power of the excimer laser oscillator 11 is regulated in the sense to eliminate the abnormality. Thus, the workpiece 7 can positively be protected against occurrence of defect.

Now, description will be directed to operation of the optical processing apparatus according to the instant embodiment of the invention.

Figure 19:
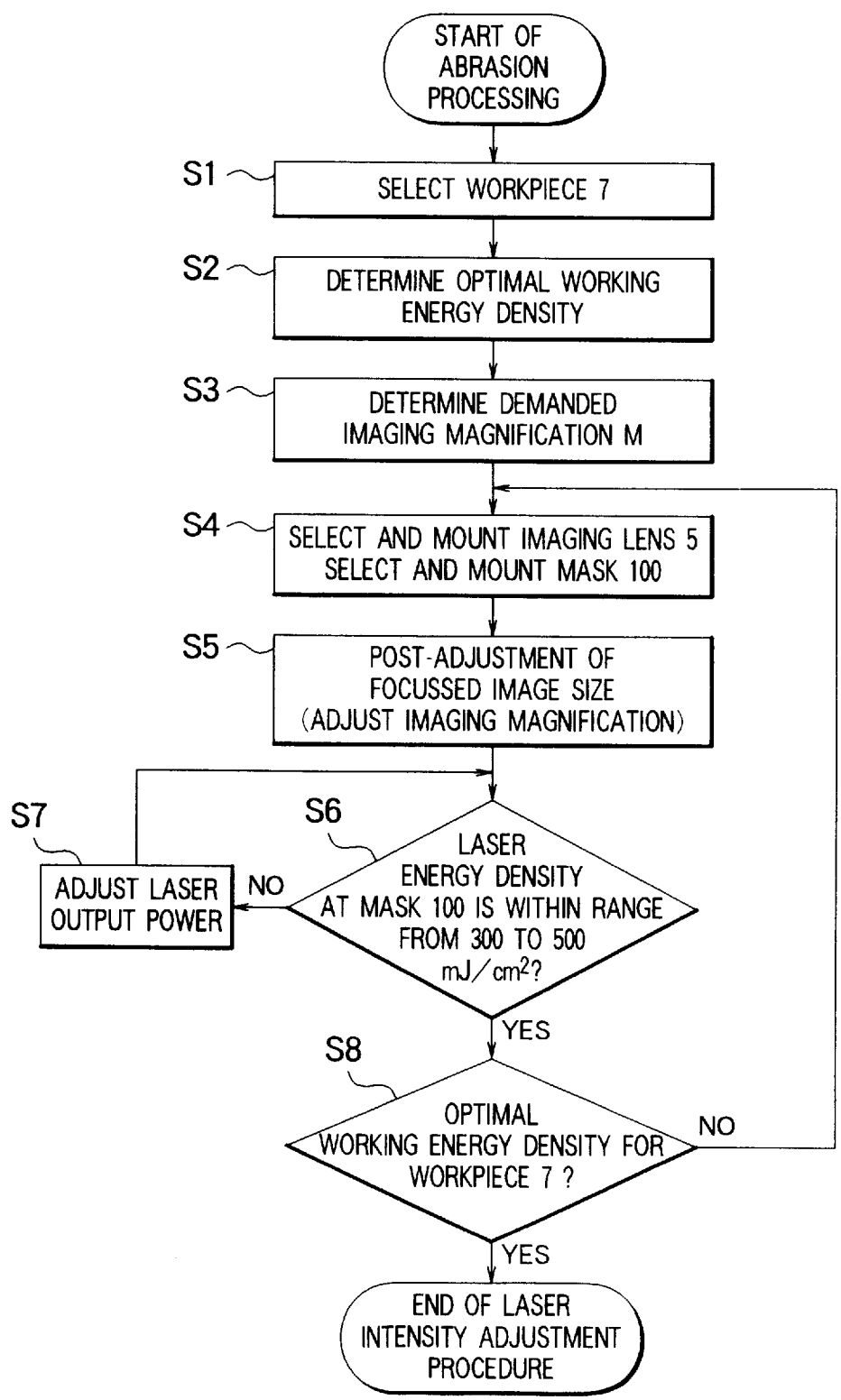
FIG. 19 is a flow chart illustrating a laser intensity adjusting procedure in the optical processing apparatus according to yet another embodiment of the present invention.

FIG. 19 is a flow chart illustrating a laser intensity adjusting procedure. For facilitation of the description, it is assumed that the desired imaging magnification represents the demanded imaging magnification.

Referring to FIG. 19, in a step S1, the workpiece 7 for ablasion processing is selected. When a workpiece made of a polyimide film is designated as the one to be processed, the optimal working energy density is determined to assume a value within the range of 0.4 to 1.2 J/cm$^2$ by referencing the table shown in FIG. 18 in a step S2. Further, the illumination energy density of the KrF-laser beam B of the mask 100 is set to a level within the range of 300 to 500 mJ/cm$^2$ while the demanded imaging magnification M for realizing the working energy density of 0.4 to 1.2 J/cm$^2$ optimal for the workpiece 7 is determined so as to lie within the range of 1/0.9 to 1/2.0 by referencing the data table shown in FIG. 18 (see step S3 in FIG. 19).

After determination of the demanded imaging magnification M, the focal length f for realizing the demanded imaging magnification of (1/0.9 to 1/2.0) is calculated in accordance with the expression (6). Subsequently, the imaging lens 5 having the focal length f is selected and mounted on the z-axis lens moving mechanism 51. Thereafter, the mask 100 is mounted fixedly on the mask holder 30 in such disposition that the dielectric thin film 102 faces in opposition to the high reflectivity mirror 2, and the workpiece 7 is mounted fixedly on the workpiece holder assembly 70 (see step S4 in FIG. 19).

In this state, the mask 100 is illuminated with the KrF-laser beam B. The KrF-laser beam B undergoes multiple reflections between the high reflectivity mirror 2 and the dielectric thin film 102 of the mask 100, which ultimately leads to transmission of the KrF-laser beam B having the illumination energy density of 300 to 500 mJ/cm$^2$ through the light-transmitting portion 100$a$. Under the optical action of the imaging lens 5, the laser beam having the optimal working energy density which is theoretically of 0.4 to 1.2 J/cm$^2$ impinges onto the workpiece 7. However, in practical applications, the actual imaging magnification M' may often be out of coincidence with the demanded imaging magnification M. Accordingly, fine adjustment of the imaging magnification is performed with the aid of the z-axis lens moving mechanism 51 and the z-axis workpiece moving mechanism 61 to thereby establish the final image size (see step S5 in FIG. 19).

More specifically, the pattern of the mask 100 is copied to the workpiece 7 with the KrF-laser beam B. The pattern as copied is viewed through the work pattern observing device 8. The corresponding information delivered then from the image processing unit 83 is inputted to the actual imaging magnification arithmetic module 91 of the central control unit 9 for determining the actual imaging magnification M'. In the magnification decision module 92, it is decided whether or not the difference between the actual imaging magnification M' and the demanded imaging magnification M is within the permissible value range δ. Unless the difference is beyond the above range δ, the calculated mask-to-lens distance Δa and the calculated mask-to-workpiece distance Δw are determined by the z-axis displacement control module 93 on the basis of the M, the actual imaging magnification M' and the focal length f of the imaging lens 5 in accordance with the expressions (1) and (2) mentioned hereinbefore in conjunction with the first embodiment of the invention. In succession, the z-axis lens moving mechanism 51 is so controlled that the actual distance between the mask 100 and the imaging lens 5 coincides with the calculated mask-to-lens distance Δa while controlling the z-axis workpiece moving mechanism 61 so that the actual distance between the mask 100 and the workpiece 7 coincides with the calculated mask-to-workpiece distance Δw. In this way, the imaging magnification is automatically adjusted.

After the fine adjustment of the imaging magnification in the manner as described above, the central control unit 9 determines the illumination energy density on the basis of the laser intensity indicated by the signal outputted from the first laser intensity sensor 120 and makes decision whether the illumination energy density falls within the range of 300 to 500 mJ/cm$^2$ (see step S6 in FIG. 19).

When it is decided that the illumination energy density is outside of the range from 300 to 500 mJ/cm$^2$, the aforementioned decision step is again executed after adjusting one more adjustment of the laser power of the excimer laser oscillator 11 (see a step S7 in FIG. 19 which follows the step S6 when the answer thereof is negative "NO").

On the other hand, when it is decided that the illumination energy density lies within the range of 300 to 500 mJ/cm$^2$, the working energy density for the workpiece 7 after the adjustment is determined on the basis of the laser intensity indicated by the signal from the second laser intensity sensor 121 to thereby decide whether the working energy density as determined falls within the optimal working energy density range (see step S8 in FIG. 19).

When decision is made that the working energy density of concern is outside of the optical working energy density range, selection of the imaging lens 5 and others as well as exchange thereof is performed (see a step S4 following the step S8 when the answer thereof is "NO"). By contrast, when it is decided that the working energy density under consideration lies within the optimal working energy density range, the laser illumination intensity adjustment procedure is completed (i.e., the step S8 in FIG. 19 results in affirmation "YES"), whereupon the intrinsic ablasion processing operation is started (see the step S11 in FIG. 4 executed in response to the affirmative output of the step S10).

When the workpiece 7 of other material than the polyimide film, it is of course possible to determine the optimal working energy density and the demanded imaging magnification M by referencing the data table shown in FIG. 18, whereon the demanded imaging magnification M can be realized through the adjusting procedure described previously.

Thus, with the optical processing apparatus according to the instant embodiment of the invention, an extended use life of the mask 100 as well as the high quality of the processed workpiece 7 can be ensured by virtue of such arrangement that the illumination energy density for the mask 100 is set at a level within the range of 300 to 500 mJ/cm$^2$ while the optimal working energy density demanded for ablation processing of the workpiece 7 is ensured by changing the imaging magnification of the optical system. Further, by constituting the dielectric thin film 102 from the dielectric layers 103 of high refractive index and the dielectric layers 104 of low refractive index stacked alternately in a number of 20 to 30 layers or laminae, the multiple reflections by the high reflectivity mirror 2 can be realized with an enhanced efficiency.

Additionally, because the capability of controlling the illumination energy density of the excimer laser oscillator 11 is imparted to the central control unit 9 in combination with provisions of the first laser intensity sensor 120 and the second laser intensity sensor 121, high processing reliability and an improved working energy efficiency can be ensured.

With regards to the other respects, the optical processing apparatus according to the instant embodiment is substantially the same as the first to seventh embodiments. Accordingly, any further description of the instant embodiment will be unnecessary.

Many features and advantages of the present invention are apparent form the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, in the case of the first to seventh embodiments described above, the excimer laser oscillator 11 is employed. This is because the excimer laser is effective for carrying out fine processing on the order of 50 µm or less. It will however be appreciated that in the case of applications where such fine or minute processing is not required, other laser device such as a YAG-laser, a CO$_2$-laser or the like having large emission wavelength may equally be employed. In the case of the first to seventh embodiments, the imaging magnification changing mechanisms such as the z-axis (optical axis) lens moving mechanism 51, the z-axis workpiece moving mechanism and the like are used for realizing fine or minute adjustment of the imaging magnification. This arrangement is very effective for forming minute holes of a diameter smaller than 20 µm or realizing the positional tolerance within ±5 µm. To say in another way, in the applications where such strict dimensional requirements are not imposed, the imaging magnification changing mechanisms mentioned above may be spared. Further, in the optical processing apparatus according to the first to seventh embodiments, the copied pattern observing device 8 is implemented as a combination of the magnifying lens 81 and the two-dimensional CCD camera 82. It is however obvious that other structure may be adopted for implementing the copied pattern observing device 8. In the case of the optical processing apparatus according to the eighth embodiment of the invention, the imaging magnification is adjusted in dependence on the materials constituting the workpiece 7. However, the invention is never restricted to such arrangement. It goes without saying that adjustment to the recommendable imaging magnification such as shown in FIG. 18 may equally be adopted. In that case, the illumination energy density of 300 mJ/cm$^2$ is sufficient for the KrF-laser beam B projected onto the mask 100. Thus, the use life of the mask 100 can further be extended. Moreover, in the optical processing apparatus according to the eighth embodiment, it is possible to provide a z-axis (optical axis) mask moving mechanism for displacing the mask 100 in the direction parallel to the optical axis L to thereby constitute the imaging magnification changing mechanism by a combination of the z-axis (optical axis) mask moving mechanism and the z-axis workpiece moving mechanism 61 or alternatively by a combination of the z-axis mask moving mechanism and the z-axis lens moving mechanism 51. With such arrangement, the distance Δw between the mask 100 and the workpiece 7 can be changed, which in turn means that the imaging magnification can be adjusted only with this arrangement without impairing the focussing performance of the optical system. It should further be added in conjunction with the optical processing apparatus according to the eighth embodiment of the invention that when the energy density of 300 to 500 mJ/m$^2$ is empirically determined as the optimal working energy density on the basis of the illumination energy density of the KrF-laser beam B impinging onto the mask 100 and the imaging magnification, the steps S6 to S8 shown in FIG. 19 can then be spared. In that case, the first laser intensity sensor 120 and the second laser intensity sensor 121 as well as the corresponding function of the central control unit 9 can be spared.

Accordingly, all suitable modifications and equivalents may be resorted to, falling within the spirit and scope of the invention.

What is claimed is:

1. An optical processing apparatus, comprising:
    a light source system for generating a light beam for illuminating a mask having a predetermined pattern;
    an imaging lens for copying a pattern image of said mask onto a workpiece;
    a mask moving mechanism for moving said mask in a direction perpendicular to an optical axis of said imaging lens;
    a workpiece moving mechanism for moving said workpiece in a direction perpendicular to said optical axis of said imaging lens;
    an imaging magnification changing mechanism for changing an inter-mask/lens/workpiece distance, which is at least one relative distance between said mask and said imaging lens, said mask and said workpiece, and said imaging lens and said workpiece; and
    a central control unit;
    wherein said central control unit includes:
        actual imaging magnification arithmetic means for determining arithmetically an actual imaging magnification value given in terms of a pattern ratio between said copied pattern image and said predetermined pattern;
        magnification decision means for making decision whether or not a difference between said actual imaging magnification value and a desired imaging magnification value is smaller than a permissible value inclusive thereof;
        optical-axis displacement control means for responsive to indication of said magnification decision means that said difference exceeds said permissible value, to thereby arithmetically determined on the basis of said actual imaging magnification value and said desired imaging magnification value said inter-mask/lens/workpiece distance at which said actual imaging magnification value becomes equal to said desired imaging magnification value for controlling thereby said imaging magnification changing mechanism so that said inter-mask/lens/workpiece distance coincides with said arithmetically determined distance; and displacement control means for controlling said mask moving mechanism and said workpiece moving mechanism.

2. An optical processing apparatus according to claim 1, further comprising:

workpiece pattern observing means for viewing said pattern image copied onto said workpiece; and image processing means for processing the pattern image picked up through said workpiece pattern observing means;

wherein said actual imaging magnification arithmetic means of said central processing unit arithmetically determines said actual imaging magnification value on the basis of information concerning said pattern image supplied from said image processing means.

3. An optical processing apparatus according to claim 2, wherein said workpiece pattern observing means includes:

a magnifying lens for magnifying said pattern image; and a two-dimensional change coupled device camera for picking up said magnified pattern image.

4. An optical processing apparatus according to one of claims 1 to 3, wherein said imaging magnification changing mechanism includes at least two of optical-axis mask moving mechanism for moving said mask in the direction of said optical axis, optical-axis imaging lens moving mechanism for moving said imaging lens in the direction of said optical axis and optical-axis workpiece moving mechanism for moving said workpiece in said optical axis; and wherein said optical-axis displacement control means of said central control unit controls two given ones of said optical-axis mask moving mechanism, said optical-axis imaging lens moving mechanism and said optical-axis workpiece moving mechanism to thereby cause said inter-mask/lens/workpiece distance to coincide with said arithmetically determined distance.

5. An optical processing apparatus according to one of claims 1 to 3, said mask having a test pattern including at least two marks, wherein said actual imaging magnification arithmetic means of said central control unit arithmetically determines a ratio between a distance between said images of said marks copied onto said workpiece and an actual distance between said marks as said actual imaging magnification value.

6. An optical processing apparatus according to one of claims 1 to 3, said mask having a test pattern including a single hole of a predetermined shape, wherein said actual imaging magnification arithmetic means of said central control unit arithmetically determines as said actual imaging magnification value a ratio between size of an image of said hole copied onto said workpiece and an actual size of said hole of said mask.

7. An optical processing apparatus according to claim 6, wherein:

said synchronous movement being effected only in one direction; and said actual imaging magnification arithmetic means of said central control unit arithmetically determines said actual imaging magnification value as a ratio between the size of a pattern hole image copied onto said workpiece during said synchronous movement and the actual size of said pattern hole of said mask.

8. An optical processing apparatus according to claim 7, wherein said synchronous mask moving mechanism serves also as said mask moving mechanism with said synchronous workpiece moving mechanism serving also as said workpiece moving mechanism.

9. An optical processing apparatus according to one of claims 1 to 3, further comprising:

at least two of a synchronous mask moving mechanism for moving said mask in the direction perpendicular to the optical axis of said imaging lens;

synchronous imaging lens moving mechanism for moving the imaging lens in the direction perpendicular to the optical axis thereof; and synchronous workpiece moving mechanism for moving said workpiece in the direction perpendicular to the optical axis of said imaging lens, wherein upon illumination of said mask with said light beam, said displacement control means controls two of said synchronous mask moving mechanism, said synchronous imaging lens moving mechanism and said synchronous workpiece moving mechanism to thereby cause either a combination of said mask and said imaging lens or a combination of said imaging lens and workpiece or a combination of said mask and said workpiece to move synchronously in opposite directions, respectively, at a speed ratio corresponding to said desired imaging magnification value.

10. An optical processing apparatus according to claim 9, wherein:

said synchronous movement being effected only in one direction, and said actual imaging magnification arithmetic means of said central control unit arithmetically determines said actual imaging magnification value as a ratio between a size of a pattern hole image copied onto said workpiece during said synchronous movement and an actual size of said pattern hole of said mask.

11. An optical processing apparatus according to claim 9, wherein said synchronous mask moving mechanism serves also as said mask moving mechanism with said synchronous workpiece moving mechanism serving also as said workpiece moving mechanism.

12. An optical processing apparatus according to any one of claims 1–3, wherein said workpiece has an alignment mark which is positioned so as to coincide with a center of an image plane of said pattern observing means when said workpiece is displaced by said workpiece moving mechanism in the state in which said workpiece is fixedly disposed.

13. An optical processing apparatus according to any one of claims 1–3, further comprising:

mask holder means for holding said mask in a state in which said mask pattern surface is disposed at a predetermined position;

wherein the workpiece moving mechanism for holding said workpiece in another state in which a surface of said workpiece to be processed is disposed at another predetermined position.

14. An optical processing apparatus according to claim 1, further comprising:

a workpiece height measuring device for measuring a position of said workpiece in the direction of said optical axis, wherein, said workpiece height measuring device is adapted to detect a focused state of a pattern image of said mask projected onto said workpiece, and said optical-axis displacement control means of said central control unit controls said optical-axis workpiece moving mechanism so that said workpiece is positioned at a position at which said pattern image is focused.

15. An optical processing apparatus according to claim 1, said mask being comprised of a light-transmissive substrate, a dielectric thin film formed on said light-transmissive substrate by depositing alternately two different dielectric materials differing from each other in respect to refractive index, and a pattern formed extending through said dielectric thin film;

said light source system being constituted by a laser device capable of illuminating said dielectric thin film of said mask with a laser beam having an energy density falling within a range of 300 to 500 mJ/cm$^2$;

wherein said imaging magnification value being set in accordance with energy density optimal for effecting ablasion processing on said workpiece.

16. An optical processing apparatus according to claim 15, wherein said desired imaging magnification value is given either by a demanded imaging magnification value required for copying with an optimal energy density within a range of 300 to 500 mJ/cm$^2$ or a recommendable imaging magnification for copying with a minimum energy density of 300 mJ/cm$^2$.

17. An optical processing apparatus according to one of claims 15 and 16, wherein a high-reflectivity mirror is disposed in opposition to the dielectric thin film of said mask so that multi-reflection of said light beam takes places between said high-reflectivity mirror and said dielectric thin film.

18. An optical processing apparatus according to claim 17, wherein:

said light-transmissive substrate of said mask being formed either of synthetic quartz glass or fluorite;

of said two dielectric thin films, the dielectric thin film having a higher refractive index is formed either of hafnium oxide or scandium oxide, and the dielectric material having a lower refractive index is formed either of silicon oxide or magnesium fluoride; and said dielectric materials of high refractive index and low refractive index being stacked in 20 to 30 laminae.

19. An optical processing apparatus according to claim 17, wherein said mask is formed with a reference light beam transmitting portion at a predetermined location of said dielectric thin film for allowing a portion of said laser beam to pass therethrough, further comprising:

first laser intensity sensor means for detecting intensity of the laser beam having passed through said reference light transmitting portion.

20. An optical processing apparatus according to claim 17, further comprising:

second laser intensity sensor means for detecting the intensity of the laser beam with which the surface of said workpiece to be processed is illuminated.

21. An optical processing apparatus according to claim 17, wherein said laser beam is emitted by a KrF-laser and has a wavelength of 248 nm.

22. An optical processing apparatus comprising:

a light source;

a mask provided with a light transmitting portion for allowing a light beam emitted from said light source to pass therethrough and a light reflecting portion for reflecting said light beam;

reflecting means disposed in opposition to said light transmitting portion for directing light rays reflected at said light reflecting portion toward said mask;

a workpiece to be optically processed;

an imaging lens for copying a pattern formed by light rays transmitted through said mask onto said workpiece;

magnification changing means for controllably changing respective distances between said mask, imaging lens, and workpiece so as to change an amount of magnification by which said pattern is formed on said workpiece, comprising, means for calculating said respective distances based on an actual magnification value and a desired magnification value, and means for moving at least two of said mask, said imaging lens and said workpiece in parallel with each other in a direction orthogonal to said optical axis of said imaging lens thereby to process said workpiece optically;

mask holder means for holding said mask in a state in which a pattern surface of said mask is disposed at a predetermined position; and workpiece holder means for holding said workpiece in another state in which a surface of said workpiece to be processed is disposed at another predetermined position.

23. An optical processing apparatus according to one of claims 1 or 22, wherein said light source system comprises an excimer laser system.

24. An optical processing apparatus according to claim 23, wherein said workpiece comprises a green sheet for a multi-layer printed substrate containing polyimide or ceramic to be fired under illumination of said light beam.

25. An optical processing apparatus according to one of claims 1 or 22, further comprising:

a position detector disposed in association with said workpiece moving mechanism for detecting displacement of said workpiece.

26. An optical processing apparatus according to one of claims 1 or 22, further comprising:

a workpiece height measuring device for measuring a position of said workpiece in the direction of said optical axis.

27. An optical processing apparatus according to claim 26, wherein said workpiece height measuring device is constituted by either a laser-type length measuring device or a contact-type length measuring device.

28. An optical processing apparatus according to claim 22, wherein said mask has a predetermined thickness and mounted on said mask holder means in such disposition that the pattern surface of said mask faces toward said imaging lens.

29. An optical processing apparatus according to one of claims 22 and 28, wherein said mask holder means is provided with a test pattern formed either by at least two marks or a single hole of a predetermined shape.

30. An optical processing apparatus, comprising:

a light source, a mask provided with a light transmitting portion for allowing a light beam emitted from said light source to pass through and a light reflecting portion for reflecting said light beam;

reflecting means disposed in opposition to said light transmitting portion for directing light rays reflected at said light reflecting portion toward said mask;

a workpiece to be optically processed;

an imaging lens for copying a pattern formed by light rays transmitted through said mask onto said workpiece;

means for moving at least two of said mask, said imaging lens and said workpiece in parallel with each other in a direction orthogonal to said optical axis of said imaging lens thereby to process said workpiece optically;

mask holder means for holding said mask in a state in which a patterned surface of said mask is disposed at a predetermined position; and workpiece holder means for holding said workpiece in another state in which a surface of said workpiece to be processed is disposed at another predetermined position, wherein said workpiece holder means includes urging means for urging said workpiece toward said imaging lens, and a retaining member for retaining said workpiece at a surface which is to be processed and which faces towards said imaging lens.

31. In an optical processing apparatus which comprises a light source system for generating a light beam for illuminating a mask having a predetermined pattern, an imaging lens for copying a pattern image of said mask onto a workpiece, a mask moving mechanism for moving said mask in a direction perpendicular to an optical axis of said imaging lens, a workpiece moving mechanism for moving said workpiece in a direction perpendicular to said optical axis of said imaging lens, an imaging magnification changing mechanism for changing inter-mask/lens/workpiece distance, which is at least one relative distance between said mask and said imaging lens, said mask and said workpiece, and said imaging lens and said workpiece, and a central control unit, wherein said central control unit includes actual imaging magnification arithmetic means for determining arithmetically an actual imaging magnification value given in terms of a pattern ratio between said copied pattern image and said predetermined pattern, magnification decision means for making decision whether or not a difference between said actual imaging magnification value and a desired imaging magnification value is smaller than a permissible value inclusive thereof, optical-axis displacement control means for responsive to indication of said magnification decision means that said difference exceeds said permissible value, to thereby arithmetically determined on the basis of said actual imaging magnification value and said desired imaging magnification value the inter-mask/lens/ workpiece distance at which the actual imaging magnification value becomes equal to said desired imaging magnification value for controlling thereby said imaging magnification changing mechanism so that said inter-mask/ lens/workpiece distance coincides with said arithmetically determined distance, and displacement control means for controlling said mask moving mechanism and said workpiece moving mechanism, said mask having a test pattern including at least two marks, wherein said actual imaging magnification arithmetic means of said central control unit arithmetically determines a ratio between a distance between said images of said marks copied onto said workpiece and an actual distance between said marks as said actual imaging magnification value, a method of determining a imaging magnification, comprising:

a first moving step of moving said workpiece by means of said workpiece moving mechanism to thereby position mark images of said test pattern at a viewing position of said copied pattern observing means;

a first arithmetic step of observing said mark images through said copied pattern observing means to thereby determine arithmetically deviation of said mark images from a center of image plane of said copied pattern observing means with the aid of said image processing means;

a second moving step of moving said workpiece by means of said workpiece moving mechanism to thereby displace mark images toward said center of the image plane by a distance corresponding to said deviation;

a second arithmetic step of observing said mark images moved toward the center of said image plane through said copied pattern observing means to arithmetically determine deviation of said mark images from said center by said image processing means;

a third moving step of moving said workpiece by said workpiece moving mechanism so that said mark images are displaced toward the center of said image plane by a distance corresponding to the deviation determined in said second arithmetic step; and a distance arithmetic step for arithmetically determine total displacements of said mark images, respectively, as defected by position detecting means to thereby determine a distance between said at least two mark images on the basis of difference between said total displacements.

32. A method of optically processing a workpiece, comprising the steps of:

copying a pattern of a mask onto said workpiece by way of an imaging lens having a focal length capable of realizing theoretically a demanded imaging magnification and a recommendable imaging magnification;

adjusting the imaging magnification so that an actual imaging magnification value coincides with said desired imaging magnification value;

moving said mask in a direction perpendicular to an optical axis of said imaging lens;

moving said workpiece in a direction perpendicular to said optical axis;

changing an inter-mask/lens/workpiece distance, which is at least one relative distance between said mask and said imaging lens, said mask and said workpiece, and said imaging lens and said workpiece;

determining arithmetically an actual imaging magnification value given in terms of a pattern ratio between said copied pattern image and said predetermined pattern;

making a decision whether or not a difference between said actual imaging magnification value and a desired imaging magnification value is smaller that a permissible value inclusive thereof; and responding to an indication that said difference exceeds said permissible value, so as to arithmetically determine, based on said actual imaging magnification value, said inter-mask/lens/workpiece distance at which said actual imaging magnification value becomes equal to said desired imaging magnification value for controlling an imaging magnification changing mechanism so that said inter-mask/lens/workpiece distance coincides with said arithmetically determined distance.

33. An optical processing apparatus comprising:

a light source, a mask provided with a light transmitting portion for allowing a light beam emitted from said light source to pass through and a light reflecting portion for reflecting said light beam;

reflecting means disposed in opposition to said light transmitting portion for directing light rays reflected at said light reflecting portion toward said mask;

a workpiece to be optically processed;

an imaging lens for copying a pattern formed by light rays transmitted through said mask onto said workpiece;

means for moving at least two of said mask, said imaging lens and said workpiece in parallel with each other in a direction orthogonal to said optical axis of said imaging lens thereby to process said workpiece optically;

mask holder means for holding said mask in a state in which a pattern surface of said mask is disposed at a predetermined position;

workpiece holder means for holding said workpiece in another state in which a surface of said workpiece to be processed is disposed at another predetermined position; and a workpiece height measuring device for measuring a position of said workpiece in the direction of said optical axis, wherein said workpiece height measuring device is adapted to detect a focused state of a pattern image of said mask projected onto said workpiece, wherein said optical-axis displacement control means of said central control unit controls an optical-axis workpiece moving mechanism so that said workpiece is positioned at a position at which said pattern image is focused.

* * * * *